: US 12,041,809 B2
(45) Date of Patent: Jul. 16, 2024

(54) DISPLAY APPARATUS

(71) Applicant: Samsung Display Co., Ltd., Yongin-si (KR)

(72) Inventors: Kiho Bang, Yongin-si (KR); Eunhye Kim, Yongin-si (KR); Eunae Jung, Yongin-si (KR); Wonsuk Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 22 days.

(21) Appl. No.: 17/122,960

(22) Filed: Dec. 15, 2020

(65) Prior Publication Data

US 2021/0359266 A1 Nov. 18, 2021

(30) Foreign Application Priority Data

May 14, 2020 (KR) .................. 10-2020-0057814

(51) Int. Cl.
*H10K 50/844* (2023.01)
*H10K 59/121* (2023.01)
*H10K 59/122* (2023.01)

(52) U.S. Cl.
CPC ......... *H10K 50/844* (2023.02); *H10K 59/121* (2023.02); *H10K 59/122* (2023.02)

(58) Field of Classification Search
CPC ............. H01L 51/5253–5256; H01L 27/3246; H01L 27/326; H10K 50/844; H10K 59/121–122
See application file for complete search history.

(56) References Cited

U.S. PATENT DOCUMENTS

| 8,466,466 | B2 | 6/2013 | Ha et al. |
| 9,666,654 | B2* | 5/2017 | Ha ...................... H01L 27/3244 |
| 9,761,651 | B2 | 9/2017 | Chang et al. |
| 9,893,133 | B2 | 2/2018 | Park et al. |
| 10,818,874 | B2 | 10/2020 | Park |
| 2015/0021562 | A1* | 1/2015 | Kim ...................... H01L 51/003 156/247 |
| 2016/0293687 | A1* | 10/2016 | Chang .................. H10K 59/126 |
| 2017/0005155 | A1* | 1/2017 | You .................... H01L 21/32133 |

(Continued)

FOREIGN PATENT DOCUMENTS

| CN | 110021640 A | 7/2019 |
| KR | 10-1146984 B1 | 5/2012 |

(Continued)

*Primary Examiner* — Shaun M Campbell
(74) *Attorney, Agent, or Firm* — Lewis Roca Rothgerber Christie LLP

(57) ABSTRACT

A display apparatus includes a substrate having adjacent first and second areas for displaying an image, the first area including a transmission area and a pixel area, a first inorganic insulating layer on the transmission area and the pixel area, a thickness of the first inorganic insulating layer in the transmission area being less than a thickness of the first inorganic insulating layer in the pixel area, a second inorganic insulating layer on the first inorganic insulating layer to correspond to the pixel area, and defining a transmission hole corresponding to the transmission area, a first organic insulating layer on the second inorganic insulating layer, and a second organic insulating layer on the first organic insulating layer.

29 Claims, 16 Drawing Sheets

(56) References Cited

U.S. PATENT DOCUMENTS

| | | | |
|---|---|---|---|
| 2017/0221976 A1* | 8/2017 | Park | .................... H01L 51/5256 |
| 2018/0301658 A1* | 10/2018 | Chung | .................. H01L 27/326 |
| 2019/0197965 A1* | 6/2019 | Park | .................... G09G 3/3233 |
| 2019/0214601 A1* | 7/2019 | Park | .................... H01L 27/3246 |
| 2019/0280248 A1* | 9/2019 | Kwon | .................. H01L 51/5237 |
| 2019/0326560 A1* | 10/2019 | Cha | ........................ H01L 21/308 |
| 2020/0105843 A1 | 4/2020 | Baek et al. | |
| 2021/0210583 A1* | 7/2021 | Okabe | ....................... G09F 9/00 |
| 2021/0301386 A1* | 9/2021 | Bai | ......................... C23C 14/24 |

FOREIGN PATENT DOCUMENTS

| | | |
|---|---|---|
| KR | 10-2016-0014878 A | 2/2016 |
| KR | 10-2016-0117728 A | 10/2016 |
| WO | WO 2019/224917 A1 | 11/2019 |

\* cited by examiner

FIG. 14

| | THICKNESS OF FIRST INORGANIC INSULATING LAYER | NUMBER OF SAMPLES | DEFECT RATE |
|---|---|---|---|
| C1 | 0 | 20 | 100% |
| C2 | 1000 Å | 10 | 80% |
| E | 2500 Å | 10 | 0% |

DISPLAY APPARATUS

CROSS-REFERENCE TO RELATED APPLICATION

This application claims priority to, and the benefit of, Korean Patent Application No. 10-2020-0057814, filed on May 14, 2020, in the Korean Intellectual Property Office, the disclosure of which is incorporated by reference herein in its entirety.

BACKGROUND

1. Field

One or more embodiments relate to a display apparatus in which a display area is expanded to enable image representation even in an area in which a component is arranged.

2. Description of Related Art

Recently, the use of display apparatuses has diversified. As display apparatuses become slimmer and lighter, their range of use has widened.

As display apparatuses are used in various ways, various methods may be used to design the shapes of the display apparatuses. Also, the functions capable of being connected to, or linked to, display apparatuses are increasing.

SUMMARY

To increase the ability to graft or link to a display apparatus, some embodiments may provide a display apparatus having a first area in which a component such as a sensor or a camera may be arranged in a display area.

However, this issue is merely an example, and the scope of the disclosure is not limited thereby.

Additional aspects will be set forth in part in the description which follows and, in part, will be apparent from the description, or may be learned by practice of the presented embodiments of the disclosure.

According to one or more embodiments, a display apparatus includes a substrate having adjacent first and second areas for displaying an image, the first area including a transmission area and a pixel area, a first inorganic insulating layer on the transmission area and the pixel area, a thickness of the first inorganic insulating layer in the transmission area being less than a thickness of the first inorganic insulating layer in the pixel area, a second inorganic insulating layer on the first inorganic insulating layer to correspond to the pixel area, and defining a transmission hole corresponding to the transmission area, a first organic insulating layer on the second inorganic insulating layer, and a second organic insulating layer on the first organic insulating layer.

The transmission hole may be defined by an inner stepped surface that faces the transmission area and that is clad with at least one of the first organic insulating layer and the second organic insulating layer.

At least one of the first organic insulating layer and the second organic insulating layer may contact the first inorganic insulating layer in the transmission area.

The first organic insulating layer may directly contact the stepped surface.

The first organic insulating layer and the second organic insulating layer may respectively define a first opening and a second opening corresponding to the transmission hole, wherein a width of the first opening is less than a width of the transmission hole.

A width of the second opening may be greater than the width of the first opening.

A width of the second opening may be less than the width of the first opening.

The second organic insulating layer may directly contact the stepped surface.

The first organic insulating layer and the second organic insulating layer may respectively include a first opening and a second opening corresponding to the transmission hole, wherein a width of the first opening is greater than a width of the transmission hole.

A width of the second opening may be less than the width of the first opening.

A thickness of the first inorganic insulating layer in the transmission area may be about 2,500 Å or more.

The display apparatus may further include a pixel electrode on the second organic insulating layer, a third organic insulating layer covering an edge of the pixel electrode, and exposing a central portion thereof, an intermediate layer on the pixel electrode and including an emission layer, and an opposite electrode on the intermediate layer.

The intermediate layer and the opposite electrode may be on an entirety of the first area.

The display apparatus may further include a thin-film encapsulation layer including a first inorganic encapsulation layer on the opposite electrode, a second inorganic encapsulation layer on the first inorganic encapsulation layer, and an organic encapsulation layer between the first inorganic encapsulation layer and the second inorganic encapsulation layer.

The intermediate layer and the opposite electrode each may define an opening corresponding to the transmission area.

The second inorganic insulating layer may include a buffer layer directly contacting the first inorganic insulating layer, a gate insulating layer on the buffer layer, and an interlayer insulating layer on the gate insulating layer.

The display apparatus may further include a metal layer between the first inorganic insulating layer and the buffer layer.

The metal layer may be configured to receive a constant voltage.

The display apparatus may further include a thin-film transistor on the pixel area and including a semiconductor layer between the buffer layer and the gate insulating layer, a gate electrode between the gate insulating layer and the interlayer insulating layer, and an electrode layer between the interlayer insulating layer and the first organic insulating layer.

The display apparatus may further include a first pixel in the pixel area, and a second pixel in the second area, wherein, when the first pixel and the second pixel emit the same color, an emission area of the first pixel being greater than an emission area of the second pixel.

A resolution of the first area is less than a resolution of the second area, wherein the substrate includes a first organic base layer, a second organic base layer, and an inorganic base layer therebetween.

According to one or more embodiments, a display apparatus includes a substrate having adjacent first and second areas for displaying an image, the first area including a transmission area and a pixel area, a first inorganic insulating layer on the transmission area and the pixel area, a second inorganic insulating layer on the first inorganic insulating layer to correspond to the pixel area, and defining a transmission hole corresponding to the transmission area, a first organic insulating layer on the second inorganic insulating layer, a second organic insulating layer on the first organic insulating layer, and a pixel electrode on the second organic insulating layer, wherein a thickness of the first inorganic insulating layer in the transmission area is about 2,500 Å or more.

The first inorganic insulating layer may include a barrier layer.

The second inorganic insulating layer may include a buffer layer on the barrier layer, a gate insulating layer on the buffer layer, and an interlayer insulating layer on the gate insulating layer, wherein the display apparatus further includes a thin-film transistor including a semiconductor layer on the buffer layer, a gate electrode on the semiconductor layer with the gate insulating layer therebetween, and an electrode layer on the gate electrode with the interlayer insulating layer therebetween.

The first organic insulating layer and the second organic insulating layer may respectively define a first hole and a second hole corresponding to the transmission hole, wherein a width of the second hole is greater than a width of the first hole, and wherein the width of the first hole is greater than a width of the transmission hole.

A stepped surface of the transmission hole facing the transmission area, a stepped surface of the first hole, and a stepped surface of the second hole may form a stair shape.

According to one or more embodiments, a display apparatus includes a substrate having adjacent first and second areas for displaying an image, the first area including a transmission area and a pixel area, a first inorganic insulating layer on the transmission area and the pixel area, a second inorganic insulating layer on the first inorganic insulating layer to correspond to the pixel area, and defining a transmission hole corresponding to the transmission area, a first organic insulating layer on the second inorganic insulating layer, and a second organic insulating layer on the first organic insulating layer, wherein the transmission hole of the second inorganic insulating layer has an inner stepped surface facing the transmission area, and clad with at least one of the first organic insulating layer and the second organic insulating layer.

At least one of the first organic insulating layer and the second organic insulating layer may contact the first inorganic insulating layer.

The first organic insulating layer may directly contact the stepped surface.

The first organic insulating layer and the second organic insulating layer may respectively define a first opening and a second opening corresponding to the transmission hole, wherein a width of the first opening is less than a width of the transmission hole.

A width of the second opening may be greater than the width of the first opening.

A width of the second opening may be less than the width of the first opening.

The second organic insulating layer may directly contact the stepped surface.

Other aspects of the disclosure will become better understood through the accompanying drawings, the claims, and the detailed description.

These general and specific aspects may be implemented by using a system, a method, a computer program, or any combinations thereof.

BRIEF DESCRIPTION OF THE DRAWINGS

The above and other aspects of embodiments of the disclosure will be more apparent from the following description taken in conjunction with the accompanying drawings, in which:

FIG. 14 is a table showing experimental results of display apparatuses of Example and Comparative Examples.

DETAILED DESCRIPTION

Figure 1:
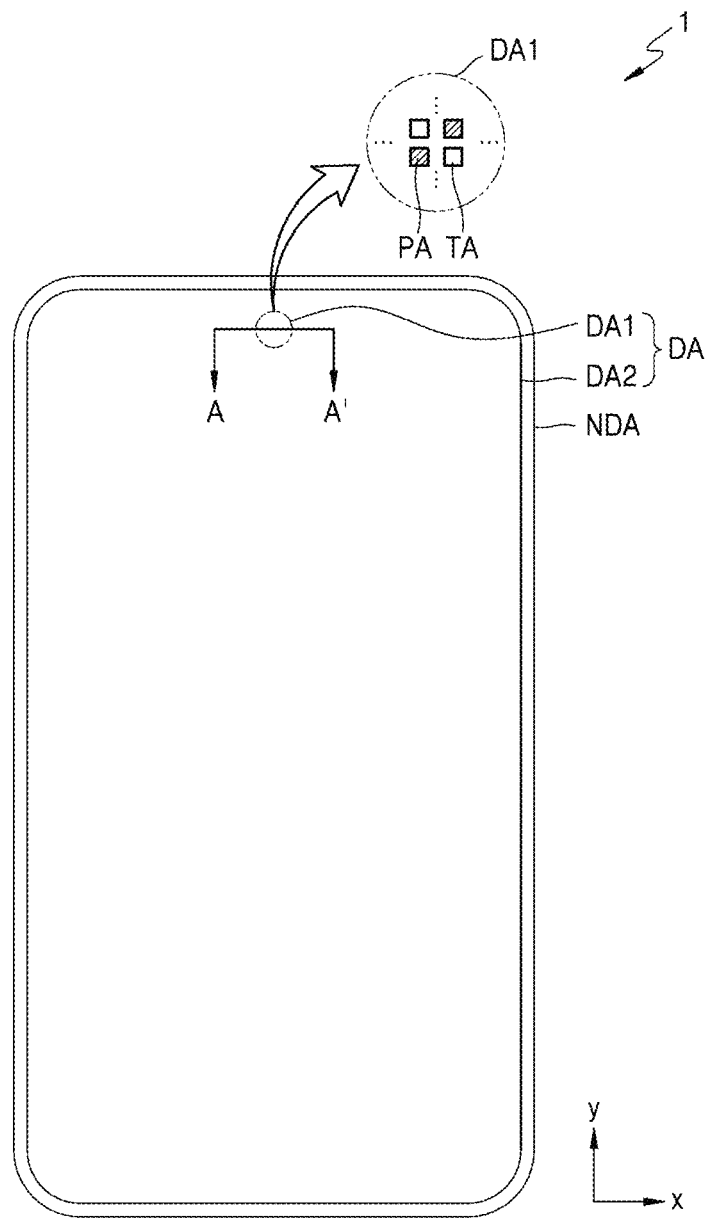
FIG. 1 is a schematic plan view of a display apparatus according to some embodiments.

Reference will now be made in detail to embodiments, examples of which are illustrated in the accompanying drawings, wherein like reference numerals refer to like elements throughout. In this regard, some embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may have various modifications and embodiments. Specific embodiments are illustrated in the drawings and will be described in detail in the detailed description. The effects and features of the disclosure and methods of achieving them will become more apparent from the following embodiments that are described in detail in conjunction with the accompanying drawings. However, the disclosure is not limited to the following embodiments and may be embodied in various forms.

Hereinafter, embodiments will be described in detail with reference to the accompanying drawings. When describing embodiments with reference to the accompanying drawings, the same or corresponding elements are denoted by the same reference numerals and a redundant description thereof will be omitted.

It will be understood that although the terms "first," "second," etc. may be used herein to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that terms such as "comprise," "include," and "have" used herein specify the presence of stated features or elements, but do not preclude the presence or addition of one or more other features or elements.

It will be understood that when a layer, region, or element is referred to as being "on" another layer, region, or element, it may be "directly on" the other layer, region, or element or may be "indirectly on" the other layer, region, or element with one or more intervening layers, regions, or elements therebetween.

In the following embodiments, it will be understood that when a layer, region, or element is referred to as being "connected to" or "coupled to" another layer, region, and element, it may be directly or indirectly connected or coupled to the other layer, region, or element. That is, for example, intervening layers, regions, or elements may be present. In the following embodiments, it will be understood that when a layer, region, or element is referred to as being "electrically connected to" or "electrically coupled to" another layer, region, and element, it may be directly or indirectly electrically connected or coupled to the other layer, region, or element. That is, for example, intervening layers, regions, or elements may be present.

In this specification, the expression "A and/or B" indicates only A, only B, or both A and B. Throughout the disclosure, the expression "at least one of A and B" indicates only A, only B, or both A and B.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

When a certain embodiment may be implemented differently, a specific process order may be performed differently from the described order. For example, two consecutively described processes may be performed substantially at the same time or performed in an order opposite to the described order.

Sizes of elements in the drawings may be exaggerated for convenience of description. In other words, because the sizes and thicknesses of elements in the drawings are arbitrarily illustrated for convenience of description, the disclosure is not limited thereto.

FIG. 1 is a schematic plan view of a display apparatus 1 according to some embodiments.

Referring to FIG. 1, the display apparatus 1 may include a display area DA, and a peripheral area NDA outside the display area DA. The display area DA may include a first area DA1 defined as a sub-display area or a component area, and a second area DA2 defined as a main display area at least partially surrounding the first area DA1. That is, the first area DA1 and the second area DA2 may display an image individually or together. The peripheral area NDA may be a non-display area in which no display elements are arranged. The display area DA may be entirely surrounded by the peripheral area NDA.

FIG. 1 illustrates that one first area DA1 is located in the second area DA2. In other embodiments, the display apparatus 1 may have at least two first areas DA1, and the first areas DA1 may have different shapes and sizes. When seen in a direction substantially perpendicular to the upper surface of the display apparatus 1, the shape of the first area DA1 may have various shapes. For example, the shape of the first area DA1 may have a polygonal shape, such as a rectangular, hexagonal, or octagonal shape, a circular shape, an oval shape, a star shape, or a diamond shape. Also, when seen in a direction substantially perpendicular to the upper surface of the display apparatus 1, FIG. 1 illustrates the first area DA1 is arranged in the upper center (+y direction) of the display area DA having corners each having a substantially rounded rectangular shape, but the first area DA1 may be arranged on one side of the display area DA, for example, on the upper right or upper left of the display area DA.

The first area DA1 may include a pixel area PA and a transmission area TA. A plurality of pixel areas PA and a plurality of transmission areas TA may be provided. In this case, the pixel areas PA and the transmission areas TA may be alternately arranged. Pixels are arranged in the pixel area PA, but pixels are not arranged in the transmission area TA. The transmission area TA is an area in which the arrangement of elements constituting a display layer (DSL in FIG. 2) is reduced or minimized. The transmission area TA may allow light to be transmitted through a substrate 100.

The display apparatus 1 may provide an image by using a plurality of first pixels (P1 in FIG. 2) that are arranged in the first area DA1, and a plurality of second pixels (P2 in FIG. 2) that are arranged in the second area DA2.

As described below with reference to FIG. 2, a component (20 in FIG. 2), which may be an electronic element, may be arranged under a display panel 10 in correspondence to the first area DA1. The component 20 may include an imaging device, such as a camera using infrared light or visible light. Alternatively, the component 20 may include a solar cell, a flash, an illumination sensor, a proximity sensor, or an iris sensor. Alternatively, the component 20 may have a function of receiving sound. To reduce or minimize the limitation of the function of the component 20, the first area DA1 may include a transmission area TA through which light and/or sound output from the component 20 to the outside, or traveling from the outside toward the component 20, may be transmitted.

In the display apparatus 1 according to some embodiments, when light is transmitted through the first display area DA1, the light transmittance may be about 10% or more, for example, about 40% or more, about 80% or more, about 85% or more, or about 90% or more.

Hereinafter, although an organic light-emitting display apparatus is described as an example of the display apparatus 1 according to some embodiments, the display apparatus according to the disclosure is not limited thereto. In other embodiments, the display apparatus 1 may include an inorganic light-emitting display apparatus, an inorganic electroluminescence (EL) display apparatus, or a quantum dot light-emitting display apparatus. For example, an emission layer of a display element provided in the display apparatus 1 may include an organic material, may include an inorganic material, may include a quantum dot, may include an organic material and a quantum dot, or may include an inorganic material and a quantum dot.

Figure 2:
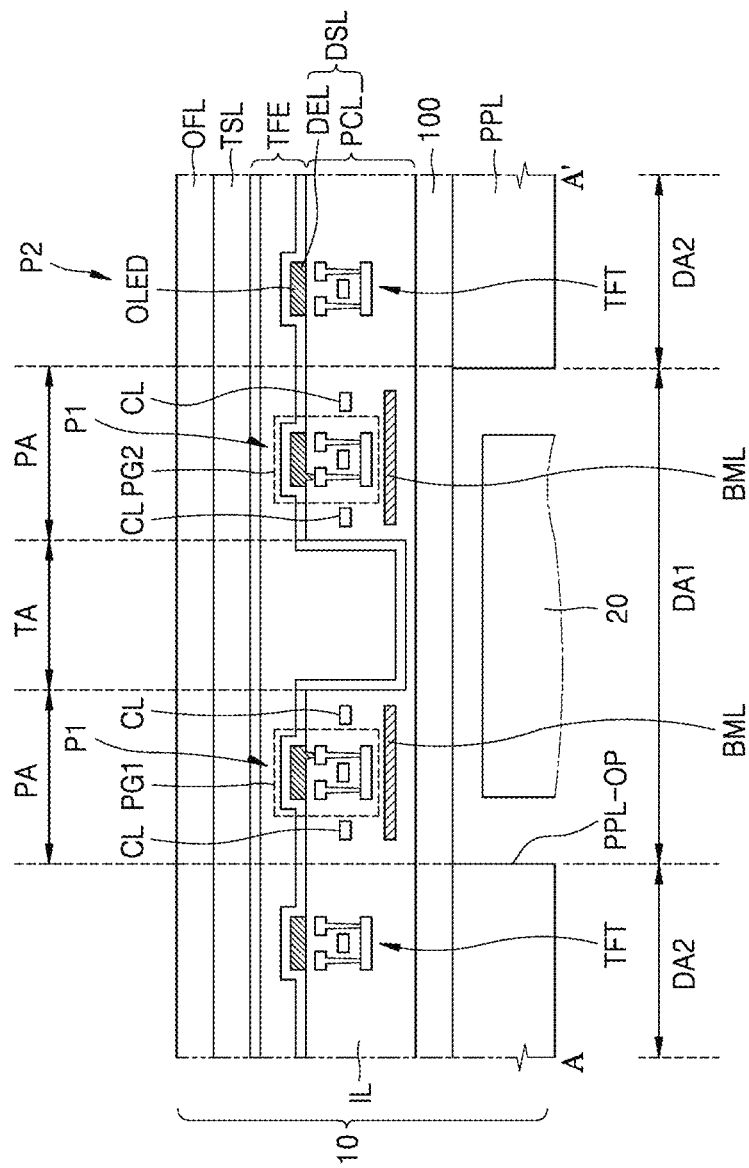
FIG. 2 is a schematic partial cross-sectional view of a display apparatus according to some embodiments.

FIG. 2 is a schematic partial cross-sectional view of a display apparatus 1 according to some embodiments.

Referring to FIG. 2, the display apparatus 1 may include a display panel 10, and a component 20 overlap the display panel 10. In some embodiments, a cover window may be further arranged on the display panel 10 so as to protect the display panel 10.

The display panel 10 includes a first area DA1 that overlaps the component 20, and a second area DA2 on which a main image is displayed. When seen in a direction substantially perpendicular to the upper surface of the display apparatus 1, the width and/or the area of the first area DA1 may be greater than the width and/or the area of the component 20.

The display panel 10 may include a substrate 100, a display layer DSL, a touch sensing layer TSL, an optical functional layer OFL, and a panel protection layer PPL arranged under the substrate 100.

The substrate 100 may include an insulating material such as a glass, quartz, or a polymer resin. The substrate 100 may include a rigid substrate or a flexible substrate that is bendable, foldable, or rollable. In some embodiments, the substrate 100 may have a multi-layered structure, and may include at least one organic layer and at least one inorganic layer.

The display layer DSL may include a pixel circuit layer PCL including a thin-film transistor TFT, a display element layer DEL including an organic light-emitting diode OLED as a display element, and a sealing member such as a thin-film encapsulation layer TFE or a sealing substrate.

Pixels P1 and P2 including a thin-film transistor TFT and an organic light-emitting diode OLED connected thereto may be arranged in the display layer DSL corresponding to the display area DA.

A first pixel P1 including a thin-film transistor TFT and an organic light-emitting diode OLED connected thereto may be arranged in a first display area DA1. In the first area DA1, at least one first pixel P1 may be grouped to form one pixel group PG. Although FIG. 2 illustrates that one first pixel P1 is included in each pixel group PG, a plurality of first pixels P1 may be included in each pixel group PG. Conductive layers ML may be located around the pixel group PG so as to electrically connect the first pixels P1 included in the adjacent pixel groups PG. The conductive layers ML may include at least one selected from a data line DL, a driving voltage line PL, a scan line SL, an emission control line EL, a previous scan line SL−1, a subsequent scan line SL+1, and an initialization voltage line VL, which will be described below with reference to FIGS. 3 to 4B.

A transmission area TA, in which no display element is arranged, may be located between the pixel groups PG of the first area DA1. The transmission area TA may be an area through which light or a signal emitted from the component 20, or light or a signal incident onto the component 20, is transmitted.

At least a portion of an insulating layer IL corresponding to the transmission area TA may be removed, and the other portions thereof may be arranged on the transmission area TA. As described above, when a portion of the insulating layer IL corresponding to the transmission area TA is removed, the light transmittance of the transmission area TA may be improved. At the same time, when the other portions of the insulating layer IL remain on the transmission area TA, flow of an outgas, which is generated in the substrate 100, into the display layer DSL may be reduced or prevented. Therefore, the reliability of the organic light-emitting diode OLED may be improved. This will be described below in detail.

The component 20 may be located in the first area DA1. The component 20 may be an electronic element using light or sound. For example, the component 20 may include a sensor (e.g., an infrared sensor) that is configured to receive and use light, a sensor that is configured to output and detect light or sound so as to measure a distance, a sensor that is configured to recognize a fingerprint or the like, a small lamp that is configured to output light, a speaker that is configured to output sound, a camera including an imaging device, and the like. When the component 20 is an electronic element using light, the component 20 may use light of various wavelength bands, such as visible light, infrared light, and/or ultraviolet light.

In some embodiments, a plurality of components 20 may be arranged in the first display area DA1. In this case, the components 20 may have different functions. For example, the components 20 may include at least two selected from a camera (imaging device), a solar cell, a flash, a proximity sensor, an illumination sensor, and an iris sensor.

A back metal layer BML may be arranged in the first area DA1. The back metal layer BML may be arranged to correspond to each pixel group PG. The back metal layer BML may reduce or prevent external light (e.g., light emitted from the component 20) from reaching the first pixel P1. Also, the back metal layer BML may reduce or prevent reflection or diffraction of light occurring while external light passes between the conductive layers ML. Therefore, image distortion (e.g., flare, haze, etc.) in the first area DA1 may be reduced or prevented.

In some embodiments, a constant voltage or a signal is applied to the back metal layer BML to reduce or prevent damage to the pixel circuit due to electrostatic discharge. In other embodiments, different voltages may be applied to back metal layers BML arranged to correspond to different pixel groups PG.

The thin-film encapsulation layer TFE may include at least one inorganic encapsulation layer and at least one organic encapsulation layer. The thin-film encapsulation layer TFE may also be arranged on the transmission area TA. In some embodiments, the thin-film encapsulation layer TFE is used as the encapsulation member for sealing the display element layer 200, but the disclosure is not limited thereto. For example, a sealing substrate that is bonded to the substrate 100 by a sealant or frit may be used as the member for sealing the display element layer DEL.

The panel protection layer PPL may be attached to the lower portion of the substrate 100 to support and protect the substrate 100. The panel protection layer PPL may include an opening PPL-OP corresponding to the first area DA1. Because the panel protection layer PPL includes the opening PPL-OP, the light transmittance of the first area DA1 may be improved. The panel protection layer PPL may include polyethylene terephthalate or polyimide.

An area of the first area DA1 may be greater than an area in which the component 20 is arranged. Therefore, an area of the opening PPL-OP provided in the panel protection layer PPL might not match an area of the first area DA1. For example, an area of the opening PPL-OP may be less than an area of the first area DA1.

The touch sensing layer TSL may obtain coordinate information according to an external input, for example, a touch event. The touch sensing layer TSL may include a touch electrode, and touch lines connected to the touch electrode. The touch sensing layer TSL may sense an external input by using a self-capacitance method or a mutual-capacitance method.

The touch sensing layer TSL may be directly formed on the thin-film encapsulation layer TFE. Alternatively, the touch sensing layer TSL may be separately formed on a touch substrate and then bonded to the thin-film encapsulation layer TFE through an adhesive layer, such as an optically clear adhesive (OCA). In some embodiments, the touch sensing layer TSL may be formed directly on the thin-film encapsulation layer TFE. In this case, the adhesive layer might not be between the touch sensing layer TSL and the thin-film encapsulation layer TFE.

The optical functional layer OFL may include an anti-reflective layer. The anti-reflective layer may reduce a reflectance of light (e.g., external light) incident from the outside toward the display apparatus 1. For example, the optical functional layer OFL may include a polarizing film. Alternatively, the optical functional layer OFL may include a filter plate including a black matrix and/or color filters.

In some embodiments, the optical functional layer OFL may include an opening corresponding to the transmission area TA. Therefore, the light transmittance of the transmission area TA may be significantly improved. The opening of the optical functional layer OFL may be filled with a transparent material, such as an optically clear resin (OCR).

A cover window may be arranged on the display panel 10 to protect the display panel 10. The optical functional layer OFL may be attached to the cover window with an OCA or may be attached to the touch sensing layer TSL with an OCA.

Figure 3:
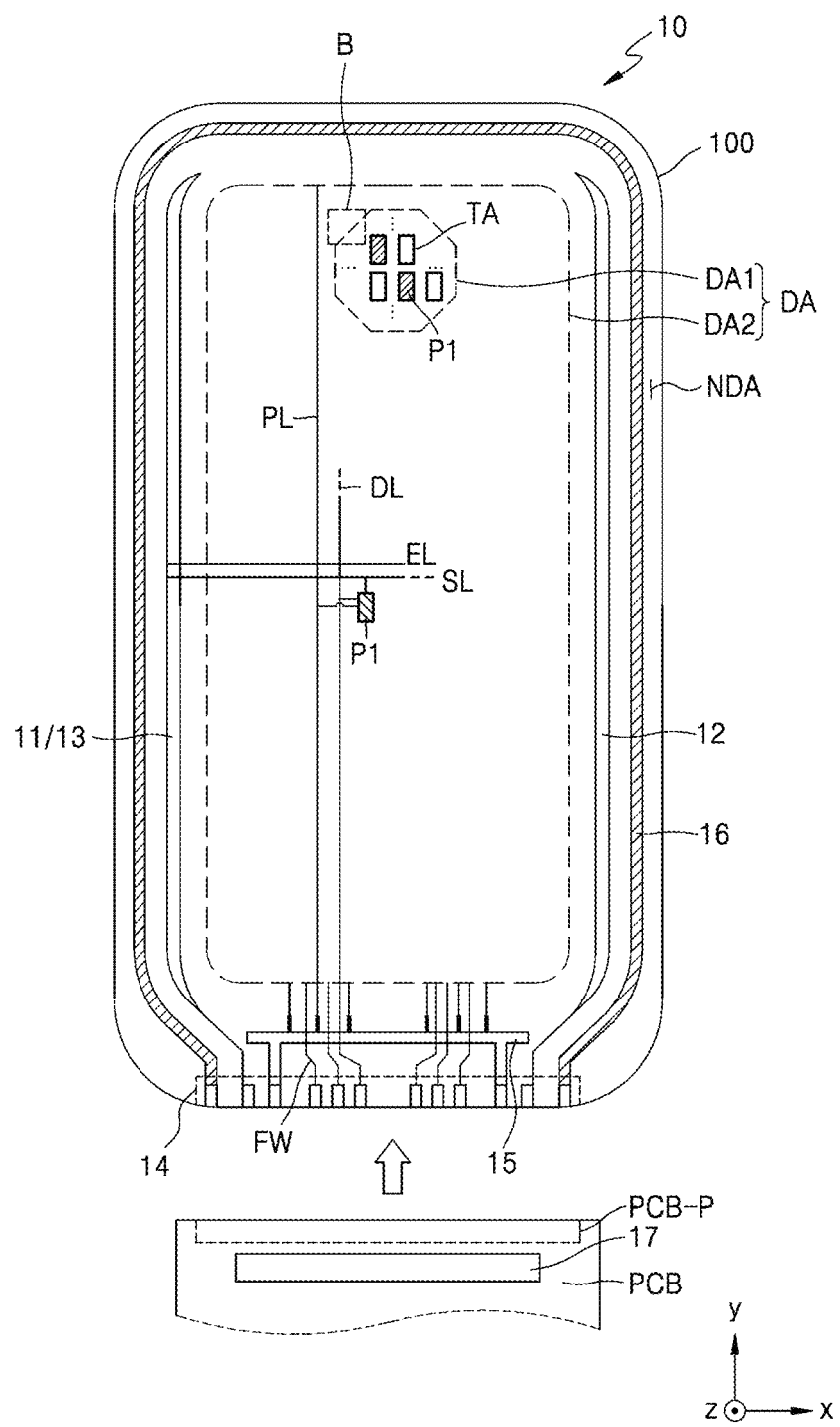
FIG. 3 is a schematic plan view of a display panel according to some embodiments.

FIG. 3 is a schematic plan view of a display panel 10 according to some embodiments.

Referring to FIG. 3, various elements constituting the display panel 10 may be arranged on a substrate 100. The substrate 100 may include a display area DA, and a peripheral area NDA surrounding at least a portion of the display area DA. The display area DA may include a first area DA1, which is defined as a sub-display area or a component area on which a sub-image is displayed, and a second area DA2, which is defined as a main display area on which a main image is displayed. The sub-image may form one whole image together with the main image, or the sub-image may be an image independent from the main image.

As illustrated in FIG. 3, the first area DA1 may be arranged in the display area DA and may be surrounded by the second area DA2. FIG. 3 illustrates that the first area DA1 has an octagonal shape. A plurality of first pixels P1 may be arranged in the first area DA1. Each of the first pixels P1 refers to a sub-pixel and may be implemented by a display element, such as an organic light-emitting diode. The first pixel P1 may emit, for example, red light, green light, blue light, and/or white light.

The first area DA1 may include a transmission area TA. The transmission area TA may be arranged to surround one or more of the first pixels P1. Alternatively, the transmission area TA may be arranged in a grid shape with the first pixels P1.

Because the first area DA1 has the transmission area TA, the resolution of the first area DA1 may be lower than the resolution of the second area DA2. For example, the resolution of the first area DA1 may be about ½, about ⅜, about ⅓, about ¼, about ⅖, about ⅛, about ⅑, or about 1/16 of the resolution of the second area DA2. For example, the resolution of the first area DA1 may be about 200 ppi or about 100 ppi, and the resolution of the second area DA2 may be about 400 ppi or more.

A plurality of second pixels P2 may be arranged in the second area DA2. Each of the second pixels P2 refers to a sub-pixel, and may be implemented by a display element, such as an organic light-emitting diode. The second pixel P2 may emit, for example, red light, green light, blue light, and/or white light.

The first and second pixels P1 and P2 may be electrically connected to external circuits arranged in the peripheral area NDA that is the non-display area. A first scan driving circuit 11, a second scan driving circuit 12, an emission control driving circuit 13, a terminal 14, a first power supply line 15, and a second power supply line 16 may be arranged in the peripheral area NDA.

The first scan driving circuit 11 may provide a scan signal to the first and second pixels P1 and P2 through a scan line SL. The second scan driving circuit 12 may be arranged in parallel with the first scan driving circuit 11 with the display area DA therebetween. Some of the first and second pixels P1 and P2 arranged in the display area DA may be electrically connected to the first scan driving circuit 11, and the others thereof may be electrically connected to the second scan driving circuit 12. In other embodiments, the second scan driving circuit 12 may be omitted.

The emission control driving circuit 13 may be arranged close to the first scan driving circuit 11 to provide an emission control signal to the first and second pixels P1 and P2 through an emission control line EL. Although FIG. 3 illustrates that the emission control driving circuit 13 is arranged on only one side of the display area DA, the emission control driving circuit 13 may be arranged on both sides of the display area DA in other embodiments, as are the first and second scan driving circuits 11 and 12.

The terminal 14 may be arranged on one side of the substrate 100. The terminal 14 may be exposed by not being covered with an insulating layer, and thus may be electrically connected to a printed circuit board (PCB). A terminal PCB-P of the printed circuit board PCB may be electrically connected to the terminal 14 of the display panel 10.

The printed circuit board PCB may transmit a signal of, or power of, a controller 17 to the display panel 10. A control signal generated by the controller 17 may be transmitted to the first and second scan driving circuits 11 and 12 and the emission control driving circuit 13 through the printed circuit board PCB. Also, the controller 17 may generate a data signal, and may transmit the generated data signal the first and second pixels P1 and P2 through a fan-out wiring FW and a data line DL connected to the fan-out wiring FW.

Also, the controller 17 may provide first and second power voltages (e.g., ELVDD and ELVSS in FIGS. 4A and 4B) to the first and second power supply lines 15 and 16, respectively. The first power supply voltage (ELVDD or driving voltage) may be provided to the first and second pixels P1 and P2 that are connected to the driving voltage line PL, which is also connected to the first power supply line 15, and the second power supply voltage (ELVSS or common voltage) may be provided to an opposite electrode of each of the first and second pixels P1 and P2 that are connected to the second power supply line 16. The first power supply line 15 may extend from the lower side of the second area DA2 in the x direction. The second power supply line 16 may partially surround the display area DA in a loop shape with one side open.

Figure 4A:
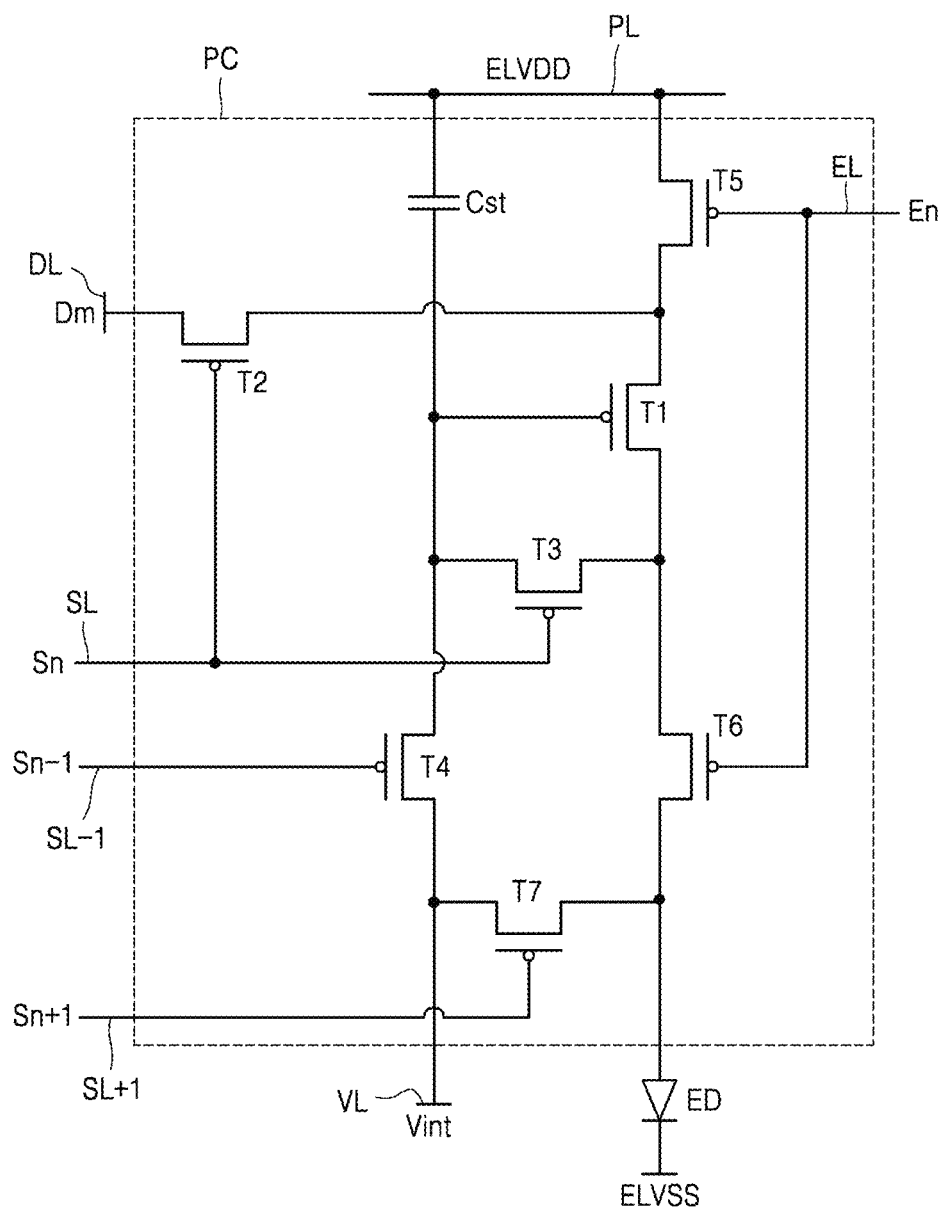
FIGS. 4A and 4B are equivalent circuit diagrams of a pixel circuit that drives a pixel, according to some embodiments.
Figure 4B:
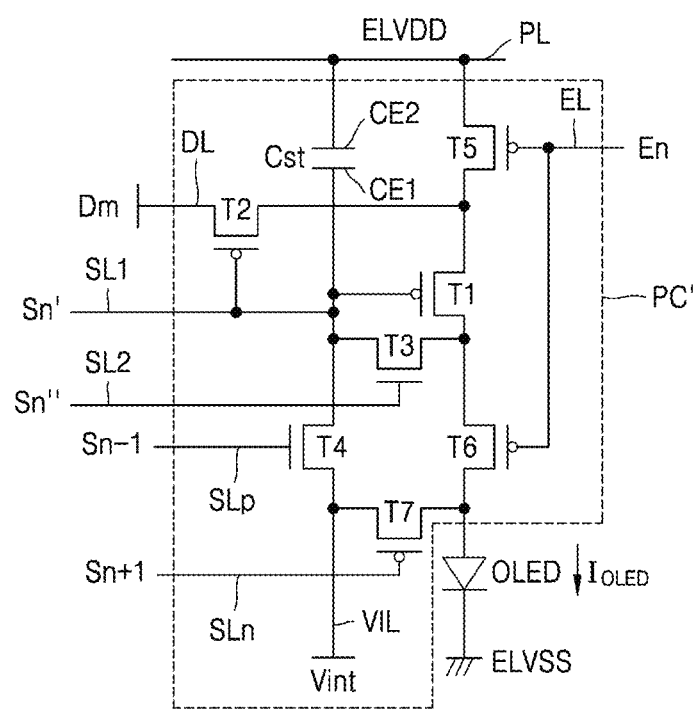

FIGS. 4A and 4B are equivalent circuit diagrams of a pixel circuit PC that drives a pixel, according to some embodiments.

Referring to FIG. 4A, the pixel circuit PC may include a plurality of thin-film transistors T1 to T7 and a storage capacitor Cst. The thin-film transistors T1 to T7 may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7. Respective ones of the thin-film transistors T1 to T7 may be electrically connected to one or more of the signal lines SL, SL−1, SL+1, EL, and DL, an initialization voltage line VL, and a driving voltage line PL, which are connected to the pixel circuit PC.

In some embodiments, the thin-film transistors T1 to T7 may be continuously provided along a semiconductor layer and integrally connected on the same layer. The semiconductor layer may be continuously provided, but may have a shape that is bent several times. In this case, the semiconductor layer may include, for example, a semiconductor layer including low temperature poly-silicon (LTPS). Because the LTPS has high electron mobility (e.g., about 100 cm$^2$/Vs or more), low energy consumption, and excellent reliability, device characteristics of the thin-film transistors T1 to T7 may be improved.

Although FIG. 4A illustrates a case in which the first initialization thin-film transistor T4 and the second initialization thin-film transistor T7 are connected to the previous scan line SL−1 and the subsequent scan line SL+1, respectively, the disclosure is not limited thereto. In other embodiments, the first initialization thin-film transistor T4 and the second initialization thin-film transistor T7 may be both connected to the previous scan line SL−1 to be driven according to a previous scan signal Sn−1.

The other electrode of the storage capacitor Cst may be connected to the driving voltage line PL. Any one electrode of the storage capacitor Cst may be connected to a gate electrode of the driving thin-film transistor T1, a drain electrode of the compensation thin-film transistor T3, and a source electrode of the first initialization thin-film transistor T4.

An opposite electrode (e.g., a cathode) of the organic light-emitting diode OLED may receive the common voltage, that is, the second power supply voltage ELVSS. The organic light-emitting diode OLED may receive a driving current from the driving thin-film transistor T1 to emit light.

The pixel circuit PC is not limited to the number and the circuit design of the thin-film transistors and the storage capacitors described above with reference to FIG. 4A, and the number and the circuit design of the thin-film transistors and the storage capacitors may be variously changed. The pixel circuit PC that drives the first pixel P1 may be identical to, or different from, the pixel circuit PC that drives the second pixel P2.

Referring to FIG. 4B, a pixel circuit PC' may include a plurality of thin-film transistors T1 to T7 and a storage capacitor Cst. The thin-film transistors T1 to T7 and the storage capacitor Cst may be variously connected to one or more of signal lines SL1, SL2, SLp, SLn, EL, and DL, an initialization voltage line VIL, and a driving voltage line PL. In some embodiments, at least one of the signal lines SL1, SL2, SLp, SLn, EL, and DL, the initialization voltage line VIL, and/or the driving voltage line PL may be shared with the adjacent pixels. A first scan signal Sn', a second scan signal Sn", a previous scan signal Sn−1, an emission control signal En, a subsequent scan signal Sn+1, and a data signal Dm may be transmitted to the pixel circuit PC' through the signal lines SL1, SL2, SLp, SLn, EL, and DL, respectively.

The thin-film transistors T1 to T7 may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

Some of the thin-film transistors T1 to T7 may each include an N-channel metal-oxide semiconductor field effect transistor (MOSFET) (NMOS), and others thereof may each include a P-channel MOSFET (PMOS). in some embodiments, the compensation thin-film transistor T3 and the first initialization thin-film transistor T4 may each include an NMOS, and the other transistors among the thin-film transistors T1 to T7 may each include a PMOS. In other embodiments, the compensation thin-film transistor T3, the first initialization thin-film transistor T4, and the second thin-film transistor T7 may each include an NMOS, and the other transistors among the thin-film transistors T1 to T7 may each include a PMOS. In some embodiments, only one of the thin-film transistors T1 to T7 may include an NMOS, and the others thereof may each include a PMOS. Alternatively, all the thin-film transistors T1 to T7 may each include an NMOS.

In some embodiments, at least one of the thin-film transistors T1 to T7 may include an oxide-containing semiconductor layer, and the others thereof may each include a silicon-containing semiconductor layer. For example, the oxide-containing semiconductor layer and the silicon-containing semiconductor layer may be arranged on different layers, and may be electrically connected to each other.

For example, the driving thin-film transistor T1, which directly influences the brightness of the display apparatus, may be configured to include a semiconductor layer including polycrystalline silicon with high reliability. In this manner, a high-resolution display apparatus is implemented. Because the oxide semiconductor has high carrier mobility and low leakage current, a voltage drop is not great even when the driving time is long. That is, because a color change of an image due to the voltage drop is not great even during low frequency driving, low frequency driving is enabled.

As such, the oxide semiconductor has a small leakage current. Therefore, when at least one of the compensation thin-film transistor T3, the first initialization thin-film transistor T4, and the second thin-film transistor T7, which are connected to the gate electrode of the driving thin-film transistor T1, includes the oxide semiconductor, the leakage current that may flow into the gate electrode of the driving thin-film transistor T1 may be reduced or prevented, and the power consumption may be reduced.

The pixel (e.g., the first pixel P1 and the second pixel P2) included in the display device according to some embodiments may have the pixel circuit PC of FIG. 4A, or may have the pixel circuit PC' of FIG. 4B. In some embodiments, the first pixel P1 may have the pixel circuit PC of FIG. 4A and the second pixel P2 may have the pixel circuit PC' of FIG. 4B. Alternatively, the first pixel P1 may have the pixel circuit PC' of FIG. 4B and the second pixel P2 may have the pixel circuit PC of FIG. 4A. As described above, in the display apparatus according to some embodiments, the display area DA may partially have different pixel circuit structures.

Figure 5:
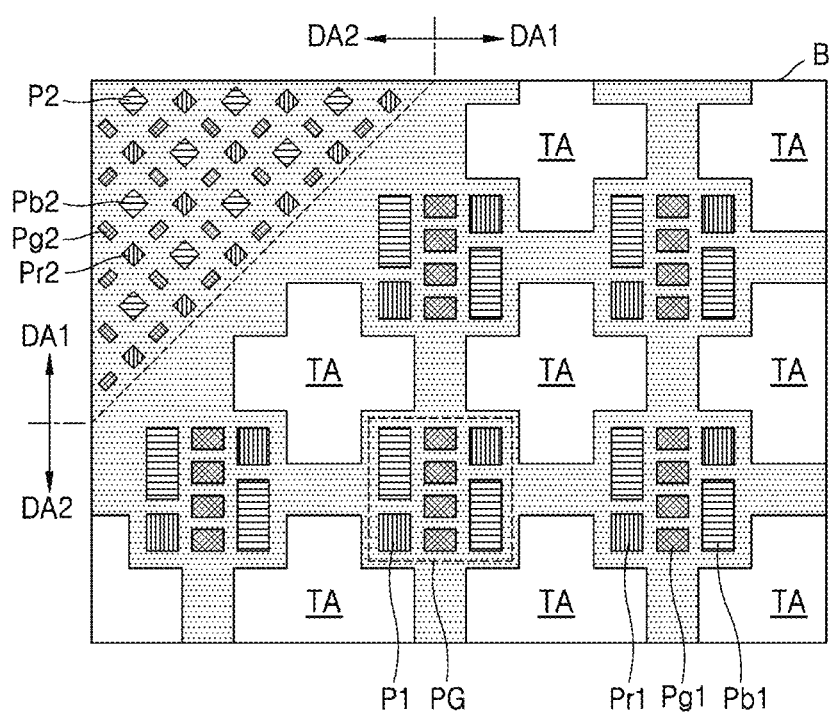
FIG. 5 is a schematic partial plan view of a display area in a display apparatus, according to some embodiments.
Figure 6:
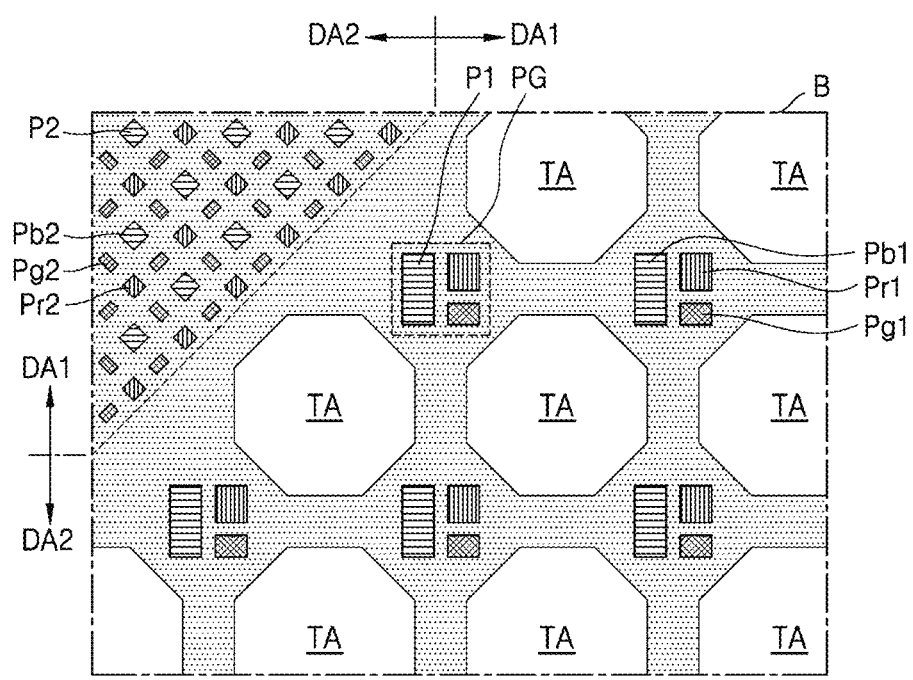
FIG. 6 is a modification of FIG. 5.

FIG. 5 is a schematic partial plan view of a display area in a display apparatus, according to some embodiments, and FIG. 6 is a modification of FIG. 5.

FIG. 5 is an enlarged view of portion B of FIG. 3. Referring to FIG. 5, a first area DA1 of a display area DA may include a pixel area PA and a transmission area TA. As illustrated in FIG. 5, a plurality of pixel areas PA and a plurality of transmission areas TA may be provided. In this case, the pixel areas PA and the transmission areas TA may be alternately arranged.

A first pixel P1 may be arranged in the pixel area PA. A plurality of first pixels P1 may be provided to form one pixel group PG. The pixel group PG may include at least one red first pixel Pr1, at least one green first pixel Pg1, and at least one blue first pixel Pb1. FIG. 5 illustrates that one pixel group PG includes two red first pixels Pr1, four green first pixels Pg1, and two blue first pixels Pb1. The disclosure is not limited thereto, and the number of first pixels Pr1, Pg1, and Pb1 included in the pixel group PG may be variously changed.

In other embodiments, as illustrated in FIG. 6, one pixel group PG may include one red first pixel Pr1, one green first pixel Pg1, and one blue first pixel Pb1. In this case, the transmission area TA may have, for example, an octagonal shape.

Respective ones of the pixel areas PA may be spaced apart from each other with the transmission area TA therebetween. In the first area DA1, the remaining areas not including the pixel area PA may be substantially used as the transmission area TA. However, the signal line (CL in FIG. 2) that electrically connects the first pixels Pr1, Pg1, and Pb1 of the pixel group PG and that transmits a signal may be connected. Therefore, in some embodiments, the transmission area TA may be substantially cross shaped (or a "+" shape). The area between the transmission areas TA may be an area in which the signal line CL is arranged. However, the disclosure is not limited thereto, and the shape of the transmission area TA may be variously changed according to the shape of the pixel area PA. The transmission area TA may have, for example, a rectangular, hexagonal, or octagonal shape.

A second pixel P2 may be arranged in a second area DA2. A plurality of second pixels P2 may be provided and may include a red second pixel Pr2, a green second pixel Pg2, and a blue second pixel Pb2.

As illustrated in FIG. 5, the arrangement of the first pixels P1 in the first area DA1 may be different from the arrangement of the second pixels P2 in the second area DA2. In some embodiments, the first pixels P1 may be arranged in the form of a pentile matrix having a rectangular shape, and the second pixels P2 may be arranged in the form of a diamond pentile matrix having a rhombus shape.

Also, in the first area DA1 and the second area DA2, the sizes of the first pixel P1 and the second pixel P2 that emit the same color may be different from each other. In this case, the "size" of the pixel may mean the "emission area" of the pixel. For example, the size of the red first pixel Pr1 arranged in the first area DA1 may be greater than the size of the red second pixel Pr2 arranged in the second area DA2. Because the first area DA1 includes, in addition to the pixel area DA, the transmission area TA as the sub-display area, the number of first pixels P1 per unit area is less than the number of second pixels P2. Therefore, the size of the first pixel P1, which emits the same color so as to balance the luminance with the adjacent second area DA2, may be greater than the size of the second pixel P2.

Figure 7A:
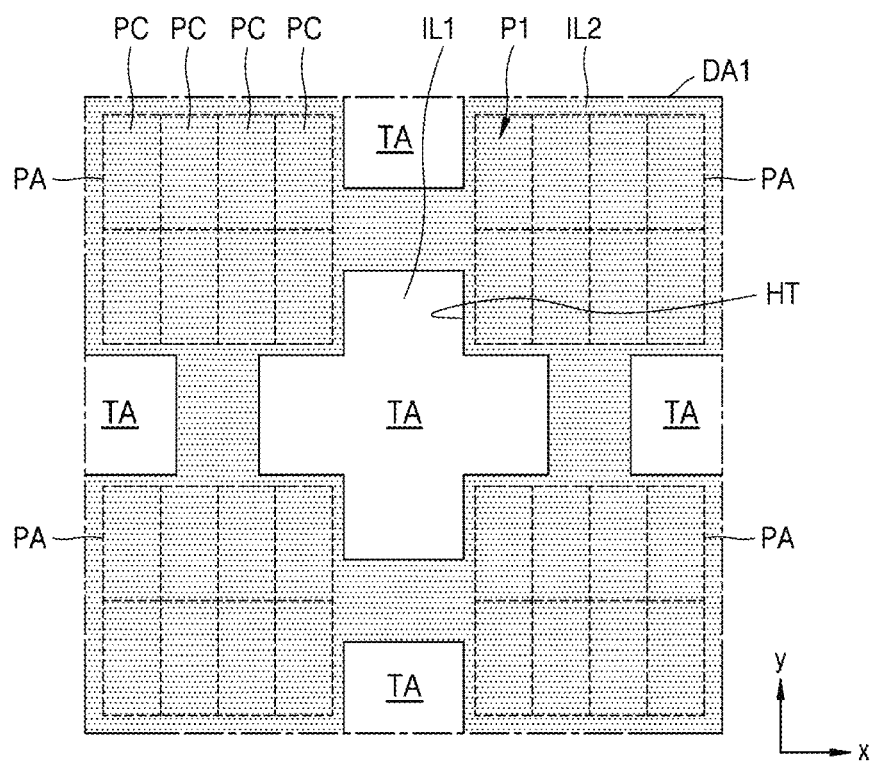
FIGS. 7A and 7B are plan views illustrating a part of a process of manufacturing a display apparatus, according to some embodiments.
Figure 7B:
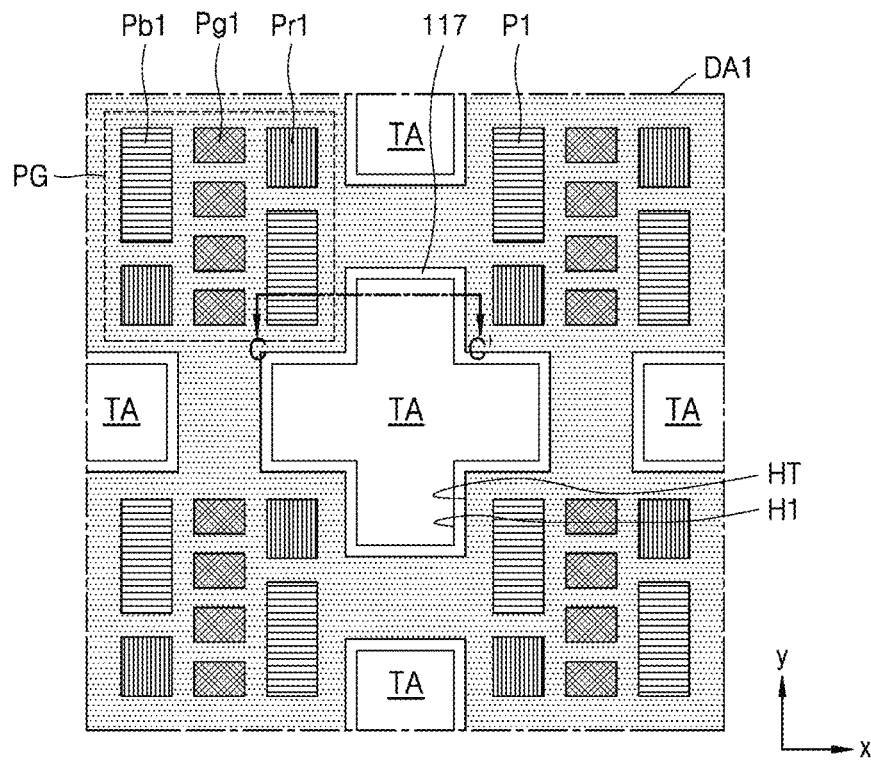
Figure 8:
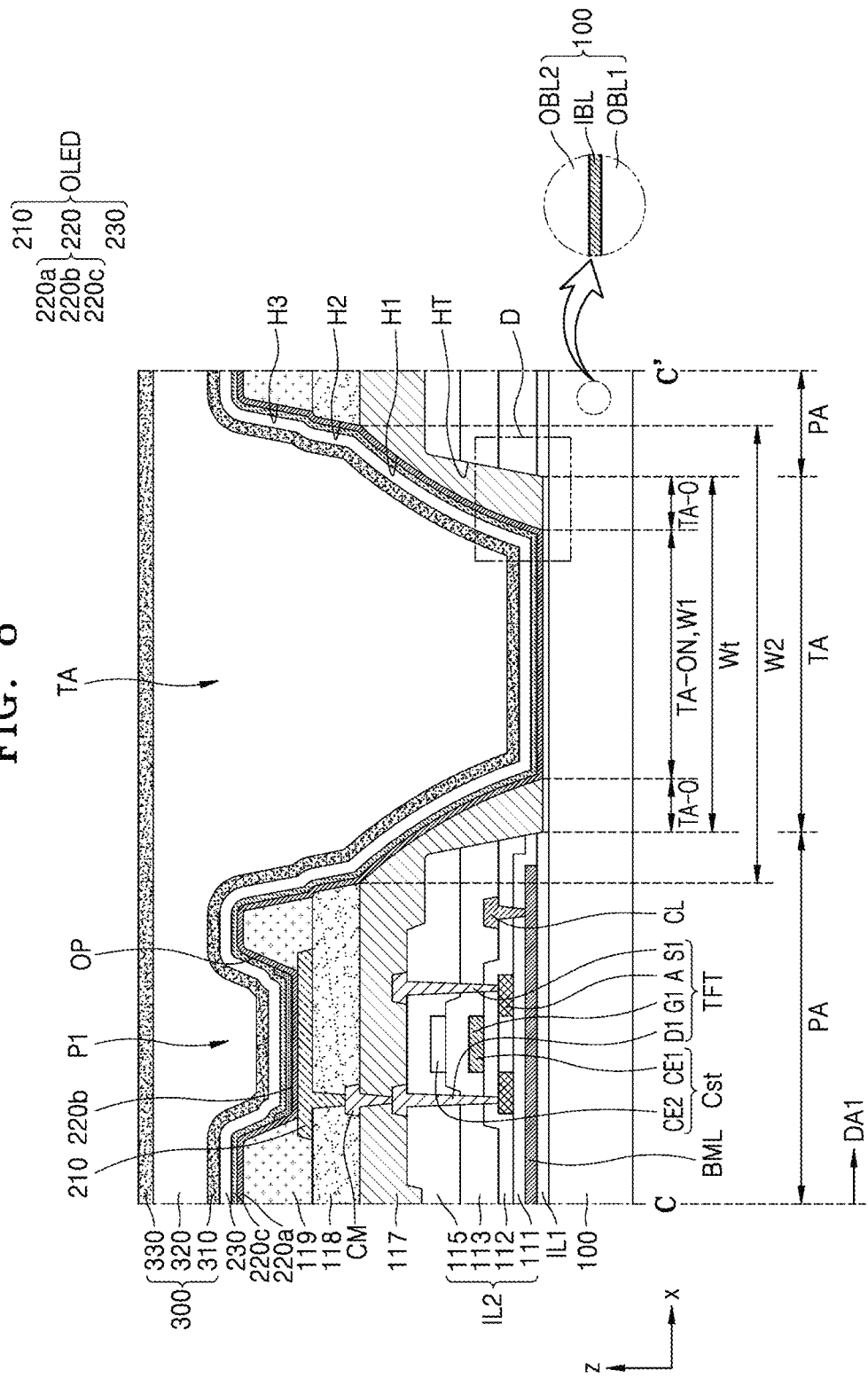
FIG. 8 is a cross-sectional view taken along the line C-C' of FIG. 7B.
Figure 9:
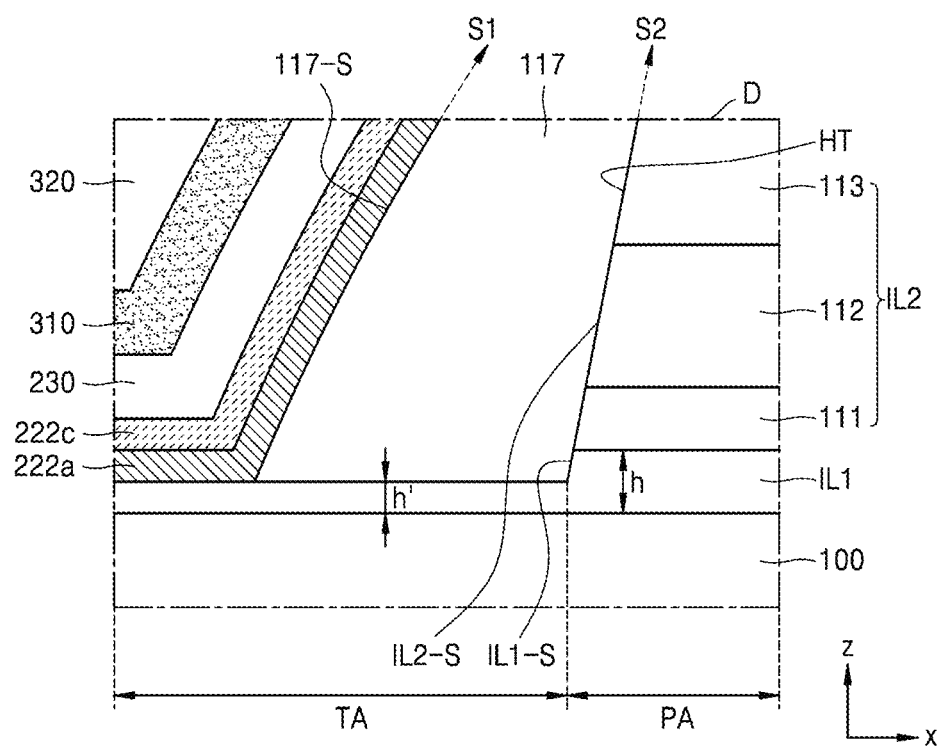
FIG. 9 is an enlarged view of portion D of FIG. 8.

FIGS. 7A and 7B are plan views illustrating a part of a process of manufacturing a display apparatus, according to some embodiments, FIG. 8 is a cross-sectional view of the display apparatus taken along the line C-C' of FIG. 7B, and FIG. 9 is an enlarged view of portion D of FIG. 8.

Referring to FIG. 7A, a pixel area PA and a transmission area TA may be arranged adjacent to each other. A pixel circuit PC to be connected to an organic light-emitting diode OLED constituting each pixel P1 may be arranged in the pixel area PA. FIG. 5 illustrates that eight pixels (e.g., sub-pixels) are arranged in one pixel area PA, and eight pixel circuits PC may be provided in the pixel area PA of FIG. 7A. Each pixel circuit PC may include a plurality of thin-film transistors T1 to T7 and a storage capacitor Cst, as illustrated in FIG. 4 described above.

In the process of forming the pixel circuit PC, a first inorganic insulating layer IL1 and a second inorganic insulating layer IL2 may be arranged on a substrate 100 corresponding to the first area DA1. The first inorganic insulating layer IL1 may be arranged in the entire first area DA1, and thus may also be arranged in the transmission area TA. The second inorganic insulating layer IL2 may include a transmission hole HT that is an opening corresponding to the transmission area TA. That is, the transmission area TA may be defined by the transmission hole HT formed in the second inorganic insulating layer IL2. In some embodiments, as illustrated in FIG. 8, the second inorganic insulating layer IL2 has a multi-layered structure including inorganic layers 111, 112, 113, and 115, and the inorganic layers 111, 112, 113, and 115 might not have excellent light transmittance. Therefore, all or part of the inorganic layers 111, 112, 113, and 115 may be removed to form the transmission area TA.

Referring to FIG. 7B, a first organic insulating layer 117 and a second organic insulating layer 118 (see FIG. 8) may be arranged on the second inorganic insulating layer IL2. In some embodiments, at least one of the first organic insulating layer 117 and the second organic insulating layer 118 may extend toward the transmission area TA, such that the at least one of the first organic insulating layer 117 and the second organic insulating layer 118 is located at the edge of the transmission area TA.

Referring to FIGS. 7B and 8 together, the substrate 100 may include a polymer resin. The substrate 100 may include at least one organic base layer including an organic material, and at least one inorganic base layer. In some embodiments, the substrate 100 may include a first organic base layer OBL1, an inorganic base layer IBL, and a second organic base layer OBL2, which are sequentially stacked. The first and second organic base layers OBL1 and OBL2 may each include a polymer resin, and the inorganic base layer IBL may be a barrier layer that reduces or prevents penetration of external foreign substances, and may include a single layer or a multi-layer including an inorganic material, such as silicon nitride ($SiN_x$) and/or silicon oxide ($SiO_x$).

In other embodiments, the substrate 100 may include an organic base layer including a polymer resin, such as polyethersulfone, polyacrylate, polyetherimide, polyethylene naphthalate, polyethyelene terephthalate, polyphenylene sulfide, polyarylate, polyimide, polycarbonate, or cellulose acetate propionate. The organic base layer may include a single layer or a multi-layer.

A first inorganic insulating layer IL1 may be arranged on the substrate 100. The first inorganic insulating layer IL1 is arranged on the entire first area DA1 over the pixel area PA and the transmission area TA. In some embodiments, a thickness of the first inorganic insulating layer IL1 arranged in the transmission area TA may be different from a thickness of the first inorganic insulating layer IL1 arranged in the pixel area PA. This will be described in detail below with reference to FIG. 9.

A first pixel P1 may be arranged to correspond to the pixel area PA. Although FIG. 8 illustrates only the stacked structure of the first pixel P1 on the first area DA1, the stacked structure of the second pixel P2 on the second area DA2 may also be substantially the same as the stacked structure illustrated in FIG. 8. However, in some embodiments, a back metal layer BML might not be arranged under the second pixel P2 on the second area DA2.

The first pixel P1 may include a thin-film transistor TFT, a storage capacitor Cst, and an organic light-emitting diode OLED. The transmission area TA may include a transmission hole HT that is an opening formed by removing some insulating layers to secure transmittance.

The thin-film transistor TFT of FIG. 8 may be one of the thin-film transistors illustrated in FIG. 4. In some embodiments, the thin-film transistor TFT of FIG. 8 may correspond to the driving thin-film transistor T1 of FIG. 4.

A back metal layer BML may be arranged under the thin-film transistor TFT of the first pixel P1 so as to overlap the thin-film transistor TFT. In other embodiments, the back metal layer BML arranged to overlap the thin-film transistor TFT may be omitted. As illustrated in FIG. 8, after the first inorganic insulating layer IL1 is formed on the substrate 100, the back metal layer BML may be arranged on the first inorganic insulating layer IL1, or may be arranged directly on the substrate 100.

In other embodiments, the back metal layer BML may be between a plurality of layers forming the substrate 100. For example, the back metal layer BML may be between the first organic base layer OBL1 and the inorganic base layer IBL, or between the inorganic base layer IBL and the second organic base layer OBL2. In other embodiments, a plurality of back metal layers BML may be provided in the first area DA1, and some back metal layers BML may be arranged on different layers.

The back metal layer BML may be arranged under the first pixel P1 to reduce or prevent the likelihood of damage or deterioration to the thin-film transistor TFT arranged in the first pixel P1 due to the component 20.

The back metal layer BML may be connected through a contact hole to a conductive layer ML arranged on another layer. The back metal layer BML may receive a constant voltage or a signal from the conductive layer ML. For example, the back metal layer BML may receive a driving voltage ELVDD or a scan signal. Because the back metal layer BML receives a constant voltage or a signal, the probability of the occurrence of electrostatic discharge may be significantly reduced. In other embodiments, all the back metal layer BML might not receive an electric signal. In other embodiments, when a plurality of back metal layers BML are provided, various modifications may be made. For example, at least one of the back metal layers BML may be electrically isolated, and the others thereof may receive an electric signal.

The back metal layer BML may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). The back metal layer BML may include a single layer or a multi-layer including the above-described materials.

The first inorganic insulating layer IL1 may be arranged on the substrate 100. The first inorganic insulating layer IL1 may reduce or block penetration of foreign substances, moisture, or external air from the bottom of the substrate 100, and may provide a flat surface on the substrate 100. The first inorganic insulating layer IL1 may include an inorganic material, such as oxide or nitride, or an organic/inorganic composite, and may have a single-layered structure or a multi-layered structure. For example, the first inorganic insulating layer IL1 may include silicon nitride ($SiN_x$), silicon oxide ($SiO_x$), and/or silicon oxynitride (SiON).

The back metal layer BML may be arranged on the first inorganic insulating layer IL1.

A thin-film transistor TFT may be arranged on the first inorganic insulating layer IL1. The thin-film transistor TFT includes a semiconductor layer A, a gate electrode G1, and a source electrode S1 and a drain electrode D1 that are electrode layers. The thin-film transistor TFT may be connected to the organic light-emitting diode OLED to drive the organic light-emitting diode OLED.

The semiconductor layer A may be arranged on the buffer layer 111 and may include polysilicon. In other embodiments, the semiconductor layer A may include amorphous silicon. In other embodiments, the semiconductor layer A may include an oxide of at least one selected from indium (In), gallium (Ga), stannum/tin (Sn), zirconium (Zr), vanadium (V), hafnium (Hf), cadmium (Cd), germanium (Ge), chromium (Cr), titanium (Ti), and zinc (Zn). The semiconductor layer A may include a channel region, and a source region and a drain region doped with impurities.

The semiconductor layer A may overlap the back metal layer BML with the buffer layer 111 therebetween. In some embodiments, a width of the semiconductor layer A may be less than a width of the back metal layer BML. Therefore, when projected in a direction perpendicular to the substrate 100, the semiconductor layer A may overlap the back metal layer BML as a whole. Also, in some embodiments, the back metal layer BML may be provided to correspond to a pixel group PG formed by gathering a plurality of first pixels P1. In this case, a plurality of semiconductor layers A may overlap the back metal layer BML.

A gate insulating layer 112 may be provided to cover the semiconductor layer A. The gate insulating layer 112 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The gate insulating layer 112 may include a single layer or a multi-layer including the above-described inorganic insulating materials.

The gate electrode G1 may be arranged on the gate insulating layer 112 so as to overlap the semiconductor layer A. The gate electrode G1 may include molybdenum (Mo), aluminum (Al), copper (Cu), titanium (Ti), or the like and may include a single layer or a multi-layer. For example, the gate electrode G1 may be a single Mo layer.

The first interlayer insulating layer 113 may cover the gate electrode G1. The first interlayer insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first interlayer insulating layer 113 may include a single layer or a multi-layer including the above-described inorganic insulating materials.

A second electrode CE2 of the storage capacitor Cst may be arranged on the first interlayer insulating layer 113. In the pixel circuit PC according to some embodiments, the second electrode CE2 may overlap the gate electrode G1 arranged thereunder. The gate electrode G1 and the second electrode CE2 overlapping each other with the first interlayer insulating layer 113 therebetween may constitute the storage capacitor Cst. The gate electrode G1 may be the first electrode CE1 of the storage capacitor Cst.

The second electrode CE2 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu) and may include a single layer or a multi-layer including the above-described materials.

The second interlayer insulating layer 115 may cover the second electrode CE2. The second interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

In some embodiments, the buffer layer 111, the gate insulating layer 112, the first interlayer insulating layer 113, and the second interlayer insulating layer 115, which are arranged on the first inorganic insulating layer IL1, may be collectively defined as a second inorganic insulating layer IL2.

The second inorganic insulating layer IL2 may include a transmission hole HT that is an opening corresponding to the transmission area TA. The transmission hole HT may be formed to expose the first inorganic insulating layer IL1. The transmission hole HT may be formed by overlapping openings of the buffer layer 111, the gate insulating layer 112, the first interlayer insulating layer 113, and the second interlayer insulating layer 115, which are formed to correspond to the transmission area TA. The openings may be separately formed through separate processes or may be simultaneously formed through the same process. When the openings are formed in the separate processes, a stair-shaped stepped surface may be formed in the transmission hole HT.

In some embodiments, the first inorganic insulating layer IL1 may include a groove, or divot, extending from or corresponding to the transmission hole HT. The "groove" may mean a portion that does not pass through the first inorganic insulating layer IL1 and a part of which is recessed. In other words, the first inorganic insulating layer IL1 does not have a hole penetrating while corresponding to the transmission area TA, and the first inorganic insulating layer IL1 corresponding to the transmission area TA may have an upper surface that is partially etched. Accordingly, a portion of the first inorganic insulating layer IL1 may be arranged in the transmission area TA while having a smaller thickness than a remainder of the first inorganic insulating layer IL1 in the pixel area PA.

The source electrode S1 and the drain electrode D1, which are understood as electrode layers, may be arranged on the second interlayer insulating layer 115. The source electrode S1 and the drain electrode D1 may each include a conductive material including molybdenum (Mo), aluminum (Al), copper (Cu), titanium (Ti), and the like, and may each include a single layer or a multi-layer including the above-described materials. For example, the source electrode S1 and the drain electrode D1 may each have a multi-layered Ti/Al/Ti structure.

A first organic insulating layer 117 may be arranged to cover the source electrode S1 and the drain electrode D1. The first organic insulating layer 117 may have a flat upper surface such that a pixel electrode 210 arranged thereon is formed to be flat.

A second organic insulating layer 118 may be arranged on the first organic insulating layer 117. A contact metal CM may be arranged between the first organic insulating layer 117 and the second organic insulating layer 118. The contact metal CM may electrically connect the drain electrode D1 to the pixel electrode 210 through the contact holes formed in the first organic insulating layer 117 and the second organic insulating layer 118.

The first and second organic insulating layers 117 and 118 may include a single layer or a multi-layer including an organic material or an inorganic material. The first and second organic insulating layers 117 and 118 may include a general-purpose polymer (e.g., benzocyclobutene (BCB), polyimide, hexamethyldisiloxane (HMDSO), polymethylmethacrylate (PMMA), or polystyrene (PS)), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and any blends thereof. The first and second organic insulating layers 117 and 118 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

The first and second organic insulating layers 117 and 118 may include a first hole H1 and a second hole H2, respectively, corresponding to the transmission area TA. The first hole H1 and the second hole H2 may partially or completely overlap the transmission hole HT.

An organic light-emitting diode OLED may be arranged on the second organic insulating layer 118. The organic light-emitting diode OLED may include a pixel electrode 210, an intermediate layer 220 including an emission layer 220b, and an opposite electrode 230.

The pixel electrode 210 may include conductive oxide, such as indium tin oxide (ITO), indium zinc oxide (IZO), zinc oxide (ZnO), indium oxide ($In_2O_3$), indium gallium oxide (IGO), and/or aluminum zinc oxide (AZO). In other embodiments, the pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), and/or any compounds thereof. In other embodiments, the pixel electrode 210 may further include a layer including ITO, IZO, ZnO, or $In_2O_3$ above and/or below the reflective layer. For example, the pixel electrode 210 may have a stacked ITO/Ag/ITO structure.

A third organic insulating layer 119 corresponding to a pixel defining layer may cover each edge of the pixel electrode 210. The third organic insulating layer 119 may include an opening OP overlapping the pixel electrode 210 and defining an emission area of the pixel. The opening OP may be defined as an emission area in the first pixel P1. The third organic insulating layer 119 increases a distance between the edge of the pixel electrode 210 and the opposite electrode 230 above the pixel electrode 210, thereby preventing arcs or the like from occurring at the edge of the pixel electrode 210. The third organic insulating layer 119 may include an organic insulating material such as polyimide, polyamide, an acrylic resin, benzocyclobutene, hexamethyldisiloxane (HMDSO), and/or a phenol resin, and may be formed by spin coating or the like.

The third organic insulating layer 119 may include a third hole H3 corresponding to the transmission area TA. The third hole H3 may partially or completely overlap the transmission hole HT. Because the first to third holes H1, H2, and H3 are formed to correspond to the transmission area TA, light transmittance of the transmission area TA may be improved. The intermediate layer 220 and the opposite electrode 230, which will be described below, may be arranged on inner walls of the first to third holes H1, H2, and H3.

A first functional layer 220a may be arranged to cover the third organic insulating layer 119. The first functional layer 220a may include a single layer or a multi-layer. The first functional layer 220a may include a hole transport layer (HTL) having a single-layered structure. Alternatively, the first functional layer 220a may include a hole injection layer (HIL) and an HTL.

An emission layer 220b formed to correspond to the pixel electrode 210 may be arranged on the first functional layer 220a. The emission layer 220b may include a high molecular weight material or a low molecular weight material, and may emit red light, green light, blue light, and/or white light.

A second functional layer 220c may be formed on the emission layer 220b. The second functional layer 220c may include a single layer or a multi-layer. The second functional layer 220c may include an electron transport layer (ETL) and/or an electron injection layer (EIL). The first functional layer 220a and the second functional layer 220c may be integrally formed to commonly correspond to the pixels (P1 and P2 in FIG. 2) included in the first area DA1 and the second area DA2. In other embodiments, the first functional layer 220a and/or the second functional layer 220c may be omitted.

The opposite electrode 230 may be arranged on the second functional layer 220c. The opposite electrode 230 may include a conductive material having a low work function. For example, the opposite electrode 230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and/or any alloys thereof. Alternatively, the opposite electrode 230 may further include a layer such as ITO, IZO, ZnO, and/or $In_2O_3$ on the (semi)transparent layer including the above-described materials. The opposite electrode 230 may be integrally provided on the display area DA.

A capping layer may be formed on the opposite electrode 230 so as to improve the light extraction rate of light emitted from the organic light emitting diode OLED. The capping layer may include, for example, LiF. Alternatively, the capping layer may include an inorganic insulating material such as silicon nitride, and/or an organic insulating material. In some embodiments, the capping layer may be omitted.

The organic light-emitting diode OLED may be sealed by a thin-film encapsulation layer 300. The thin-film encapsulation layer 300 may be arranged on the opposite electrode 230. When the capping layer is formed on the opposite electrode 230, the thin-film encapsulation layer 300 may be arranged on the capping layer. The thin-film encapsulation layer 300 may reduce or prevent external moisture or foreign substances from penetrating into the organic light-emitting diode OLED.

The thin-film encapsulation layer 300 may include at least one inorganic encapsulation layer and at least one organic encapsulation layer. In this regard, FIG. 8 illustrates the thin-film encapsulation layer 300 having a structure in which a first inorganic encapsulation layer 310, an organic encapsulation layer 320, and a second inorganic encapsulation layer 330 are stacked. In other embodiments, the number of organic encapsulation layers, the number of inorganic encapsulation layers, and the stacking order may be changed.

The first inorganic encapsulation layer 310, the organic encapsulation layer 320, and the second inorganic encapsulation layer 330 may be integrally formed to cover the first area DA1 and the second area DA2. Therefore, the first inorganic encapsulation layer 310, the organic encapsulation layer 320, and the second inorganic encapsulation layer 330 may be arranged in the transmission area TA.

In other embodiments, the organic encapsulation layer 320 may be integrally formed to cover the first area DA1 and the second area DA2, but might not be present in the transmission area TA. In other words, the organic encapsulation layer 320 may include an opening corresponding to the transmission area TA. In this case, the first inorganic encapsulation layer 310 and the second inorganic encapsulation layer 330 may be in contact with each other in the transmission hole HT.

Referring to the transmission area TA, at least a portion of the first inorganic insulating layer IL1 may be arranged in the transmission area TA. In some embodiments, the substrate 100 may include an organic material as described above. Outgas is generated from the organic material by heat in the manufacturing process. As a comparative example, it is assumed that the substrate is exposed as it is by removing all of the inorganic insulating layers corresponding to the transmission area to increase or maximize the transmittance of the transmission area. In this case, the transmittance of the transmission area is increased or maximized, but outgas generated in the substrate may flow into the display layer, resulting in a defect in the organic light-emitting diode OLED.

Therefore, in the display apparatus 1 according to some embodiments, because the first inorganic insulating layer IL1 is also arranged on the transmission area TA, it is possible to reduce or prevent outgas generated in the substrate 100 from flowing into the display layer to deteriorate the reliability of the organic light-emitting diode OLED.

FIG. 9 is an enlarged view of portion D of FIG. 8. Referring to FIG. 9, a thickness h' of the first inorganic insulating layer IL1 corresponding to the transmission area TA may be less than a thickness h of the first inorganic insulating layer IL1 corresponding to the pixel area PA. As described above, when the thickness h' of the first inorganic insulating layer IL1 corresponding to the transmission area TA is less than the thickness h of the first inorganic insulating layer IL1 corresponding to the pixel area PA, the light transmittance of the transmission area TA may be increased.

In the manufacturing process, mechanical or chemical polishing may be performed to reduce the thickness of the first inorganic insulating layer IL1 corresponding to the transmission area TA. Alternatively, a portion of the upper surface of the first inorganic insulating layer IL1 may be etched together in the process of forming the transmission hole HT of the second inorganic insulating layer IL2. In the first inorganic insulating layer IL1, a stepped surface (e.g., a slanted surface) IL1-S may be provided due to a difference between the thickness h' on the transmission area TA and the thickness h on the pixel area PA. In some embodiments, the stepped surface IL1-S of the first inorganic insulating layer IL1 and a stepped surface (e.g., a slanted surface) IL2-S of the second inorganic insulating layer IL2 may be the same plane. The "same plane" may mean the "same etched surface."

In some embodiments, the thickness h' of the first inorganic insulating layer IL1 corresponding to the transmission area TA may be about 2,500 Å or more. The thickness h' of the first inorganic insulating layer IL1 may be about 2,500 Å to about 8,500 Å. In some embodiments, to prevent outgas of the substrate 100, the thickness h' of the first inorganic insulating layer IL1 may be about 2,500 Å or more. However, to this end, when the thickness h' of the first inorganic insulating layer IL1 is increased to about 8,500 Å or more, the light transmittance of the transmission area TA may be lowered.

The second inorganic insulating layer IL2 may include a transmission hole HT that is an opening corresponding to the transmission area TA. The transmission hole HT may have an inner stepped surface IL2-S facing the transmission area TA.

In some embodiments, the stepped surface IL2-S of the second inorganic insulating layer IL2 may be clad with at least one of the first organic insulating layer 117 and the second organic insulating layer 118. FIGS. 8 and 9 illustrate that the stepped surface IL2-S of the second inorganic insulating layer IL2 is clad with the first organic insulating layer 117. In this case, the first organic insulating layer 117 may be in direct contact with the stepped surface IL2-S of the second inorganic insulating layer IL2.

Referring to FIG. 8, when the stepped surface IL2-S of the second inorganic insulating layer IL2 is clad with the first organic insulating layer 117, a portion of the first organic insulating layer 117 may be arranged on the edge portion of the transmission area TA to form an overlapping area TA-O. In the transmission area TA, the transmittance of a non-overlapping area TA-ON may be higher than the transmittance of the overlapping area TA-O. However, the organic material forming the first organic insulating layer 117 is basically a material having excellent light transmittance, and the influence of the overlapping area TA-O on the transmittance of the transmission area TA may be very small.

Because the stepped surface IL2-S of the second inorganic insulating layer IL2 is clad with the first organic insulating layer 117, a width W1 of the first hole H1 of the first organic insulating layer 117 in one direction (e.g., the x direction) may be less than a width Wt of the transmission hole HT of the second inorganic insulating layer IL2. Also, the second organic insulating layer 118 is arranged on the first organic insulating layer 117, and a width W2 of the second hole H2 in one direction (e.g., the x direction) may be greater than the width W1 of the first hole H1 and the width Wt of the transmission hole HT. However, the disclosure is not limited thereto and may be modified as described below.

In the overlapping area TA-O, at least a portion of the first organic insulating layer 117 may be in direct contact with the first inorganic insulating layer IL1. The first inorganic insulating layer IL1 corresponding to the non-overlapping area TA-ON may be exposed by the first hole H1 and may be in direct contact with the intermediate layer 220.

The first functional layer 220a, the second functional layer 220c, and the opposite electrode 230 may be located not only in the pixel area PA but also in the transmission area TA. The first functional layer 220a, the second functional layer 220c, and the opposite electrode 230 may be provided to cover inner surfaces of the transmission hole HT corresponding to the transmission area TA as well as all or part of the inner surfaces of the first to third holes H1, H2, and H3.

In other embodiments, to increase the light transmittance of the transmission area TA, the first functional layer 220a, the second functional layer 220c, and the opposite electrode 230 may be partially removed corresponding to the transmission area TA. For example, the first functional layer 220a, the second functional layer 220c, and the opposite electrode 230 may be partially removed by using laser lift-off, or may be partially removed through fine metal mask (FMM) patterning.

That the transmission hole HT corresponds to the transmission area TA may be understood as meaning that the transmission hole HT overlaps the transmission area TA. In this case, the area of the transmission area TA may be substantially the same as the area of the transmission hole HT formed in the second inorganic insulating layer IL2.

Figure 10:
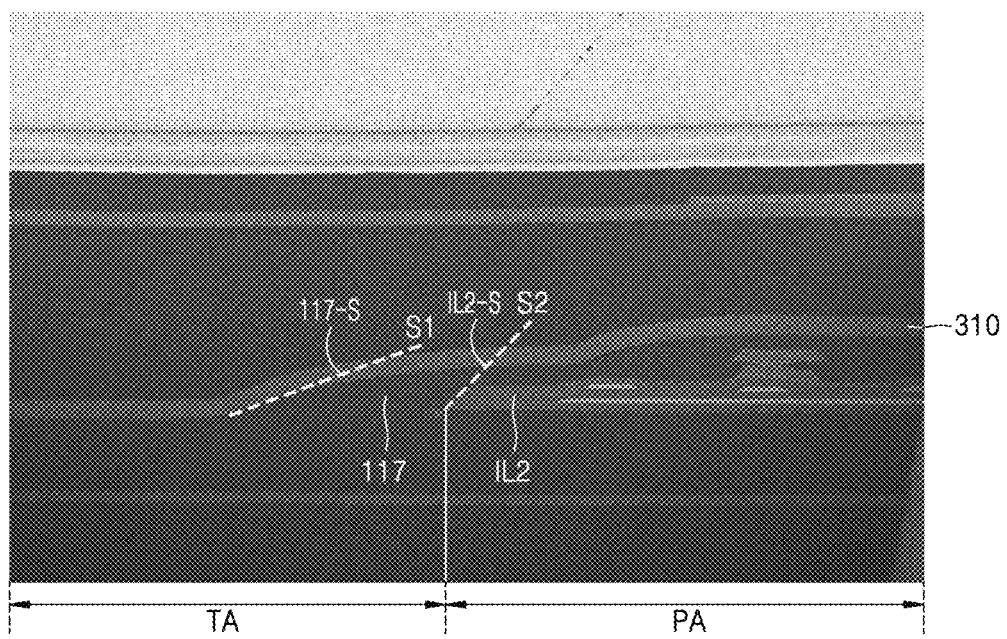
FIG. 10 is an enlarged photograph of part of a display apparatus according to some embodiments.

FIG. 10 is an enlarged photograph of part of a display apparatus according to some embodiments.

Referring to FIGS. 9 and 10 together, a slope S1 of the stepped surface 117-S of the first organic insulating layer 117 may be more gentle than a slope S2 of the stepped surface IL2-S of the second inorganic insulating layer IL2. As illustrated in FIG. 10, it may be seen that the slope of the stepped surface IL2-S of the second inorganic insulating layer IL2 is steeper than about 45° due to the characteristics of the inorganic layer having little fluidity.

As a comparative example, when the stepped surface of the second inorganic insulating layer is not clad with the first organic insulating layer, the first inorganic encapsulation layer arranged above the transmission area has a high probability of cracking due to a steep slope at the starting point of the stepped surface. Therefore, in the display apparatus 1 according to some embodiments, because the stepped surface IL2-S of the second inorganic insulating layer IL2 is clad with the first organic insulating layer 117 having relatively high fluidity, the profile of the first inorganic encapsulation layer 310 arranged in the transmission area TA is implemented more gently.

Figure 11:
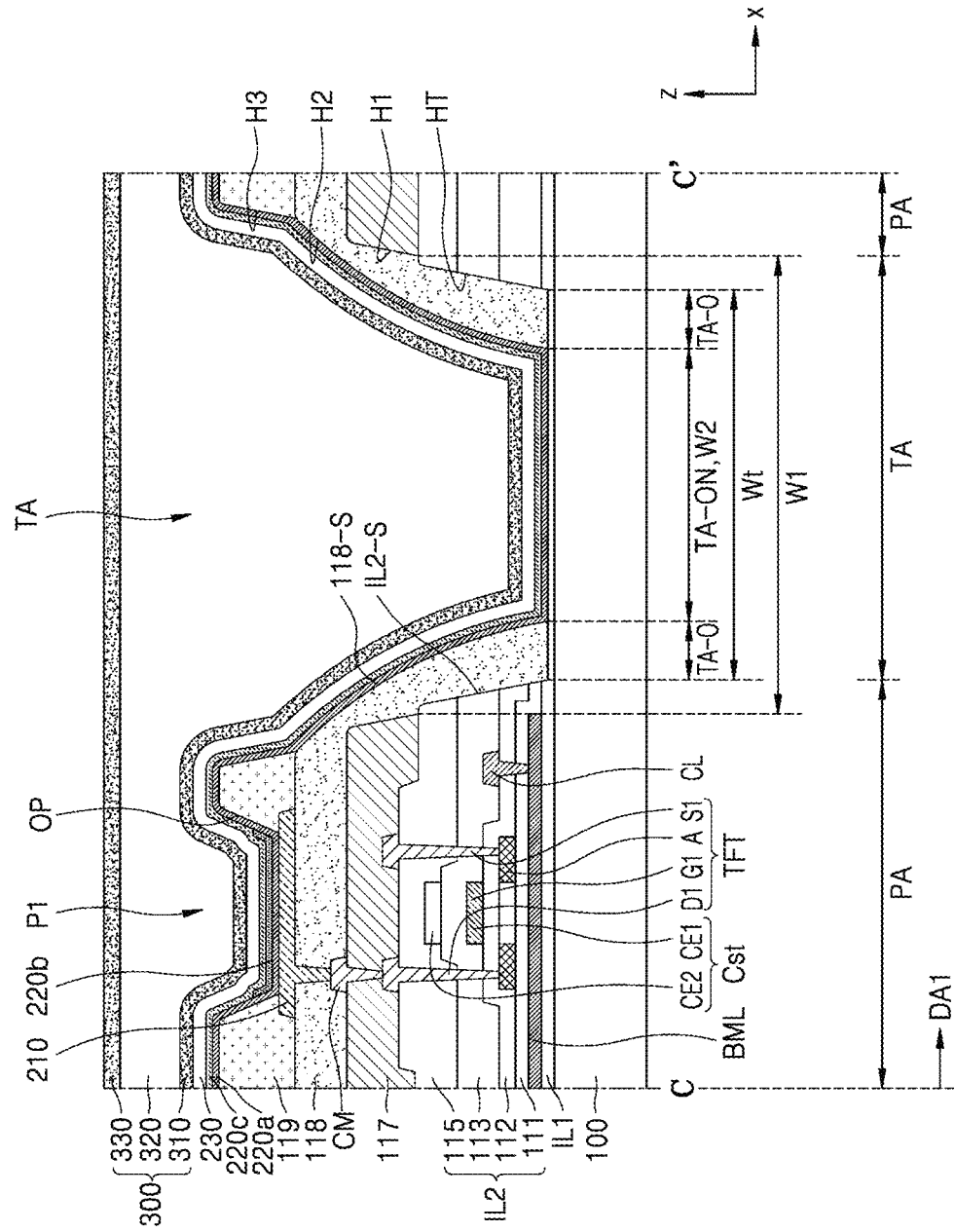
FIGS. 11 and 12 are schematic partial cross-sectional views of a display apparatus according to some embodiments.
Figure 12:
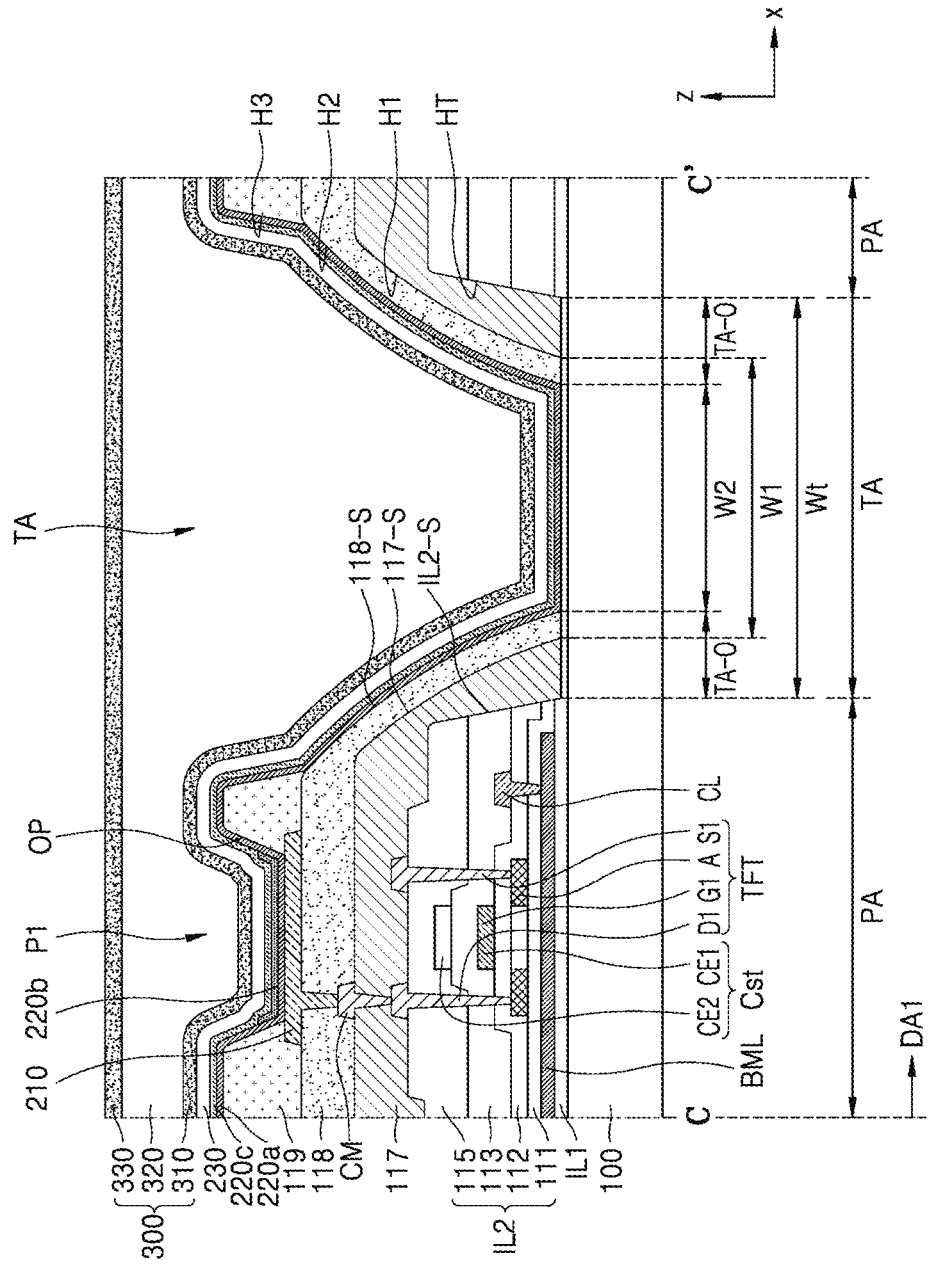

FIGS. 11 and 12 are schematic partial cross-sectional views of a display apparatus according to some embodiments.

FIGS. 11 and 12 correspond to modifications of FIG. 9. The embodiments of FIGS. 11 and 12 differ from the embodiment of FIG. 8 in the structure of the transmission area TA. Because the remaining portions not including the transmission area TA are the same as in FIG. 8 described above, the descriptions of FIGS. 11 and 12 will mainly focus on differences regarding the transmission area TA.

Referring to FIG. 11, a second inorganic insulating layer IL2 may include a transmission hole HT that is an opening corresponding to the transmission area TA. The transmission hole HT may have an inner stepped surface IL2-S facing the transmission area TA. In some embodiments, a second organic insulating layer 118 may be provided to clad a stepped surface (e.g., sloped surface) IL2-S of the second inorganic insulating layer IL2. In this case, the second organic insulating layer 118 may be in direct contact with the stepped surface IL2-S of the second inorganic insulating layer IL2.

As described above, in FIG. 11, because the second organic insulating layer 118 is provided to clad the stepped surface IL2-S of the second inorganic insulating layer IL2, the slope of a stepped surface (e.g., sloped surface) 118-S of the second organic insulating layer 118 may be more gentle than the slope of the stepped surface IL2-S of the second inorganic insulating layer IL2. Therefore, in the display apparatus 1 according to some embodiments, because the stepped surface IL2-S of the second inorganic insulating layer IL2 is clad with the second organic insulating layer 118, the profile of the first inorganic encapsulation layer 310 arranged in the transmission area TA is implemented more gently.

Because the stepped surface IL2-S of the second inorganic insulating layer IL2 is clad with the second organic insulating layer 118, a portion of the edge of the transmission area TA may be an overlapping area TA-O that overlaps the second organic insulating layer 118. In the transmission area TA, the transmittance of a non-overlapping area TA-ON may be higher than the transmittance of the overlapping area TA-O. However, the organic material forming the second organic insulating layer 118 is basically a material having excellent light transmittance, and the influence of the overlapping area TA-O on the transmittance of the transmission area TA may be very small.

In some embodiments, because the stepped surface IL2-S of the second inorganic insulating layer IL2 is clad with the second organic insulating layer 118, a width W2 of a second hole H2 in one direction (e.g., the x direction) may be less than a width Wt of a transmission hole HT. Also, the first organic insulating layer 117 is arranged on the second inorganic insulating layer IL2, and the width W1 of the first hole H1 in one direction (e.g., the x direction) may be greater than the width Wt of the transmission hole HT.

In the overlapping area TA-O, at least a portion of the second organic insulating layer 118 may be in direct contact with the first inorganic insulating layer IL1. The first inorganic insulating layer IL1 corresponding to the non-overlapping area TA-ON may be exposed by the second hole H2 and may be in direct contact with the intermediate layer 220.

Referring to FIG. 12, a stepped surface IL2-S of a second inorganic insulating layer IL2 is clad with a first organic insulating layer 117, and a second organic insulating layer 118 may cover the first organic insulating layer 117. The first organic insulating layer 117 may be in direct contact with a stepped surface (e.g., sloped surface) IL2-S of the second inorganic insulating layer IL2, and the second organic insulating layer 118 may be in direct contact with a stepped surface 117-S of a first hole H1 of the first organic insulating layer 117.

A width W2 of a second hole H2 of the second organic insulating layer 118 in one direction (e.g., the x direction) may be less than a width W1 of the first hole H1 of the first organic insulating layer 117, and the width W1 of the first hole H1 of the first organic insulating layer 117 may be less than a width Wt of a transmission hole HT. Therefore, a portion of the edge of the transmission area TA may be an overlapping area TA-O overlapping the first organic insulating layer 117 and the second organic insulating layer 118. As described above, the transmission area TA is defined as the transmission hole HT of the second inorganic insulating layer IL2, and the first organic insulating layer 117 and the second organic insulating layer 118 each include a material having excellent light transmittance. Therefore, it is possible to prevent the transmittance of the transmission area TA from being reduced due to the overlapping area TA-O.

In the overlapping area TA-O, at least a portion of the first organic insulating layer 117 and the second organic insulating layer 118 may be in direct contact with the first inorganic insulating layer IL1. The first inorganic insulating layer IL1 corresponding to the non-overlapping area TA-ON may be exposed by the second hole H2 and may be in direct contact with the intermediate layer 220.

Figure 13:
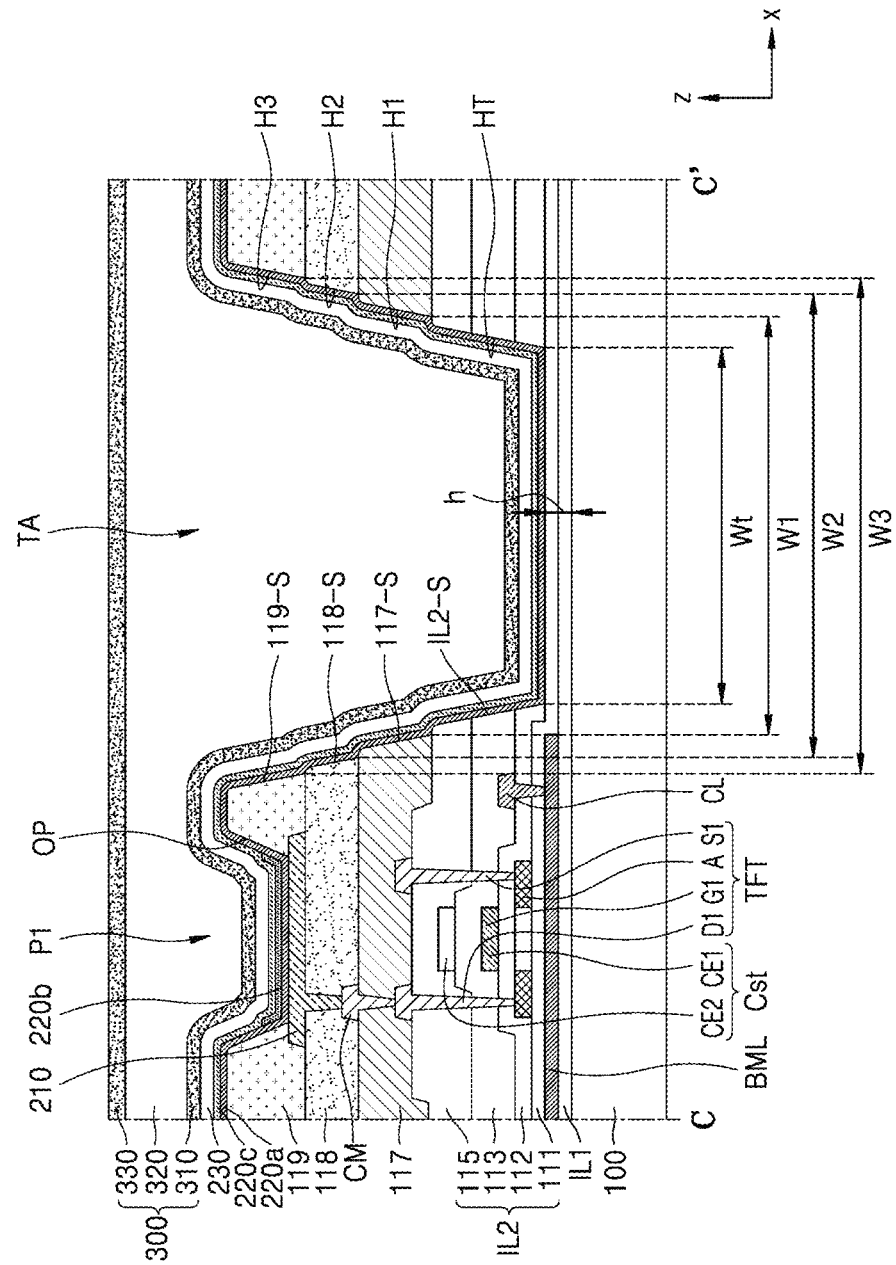
FIG. 13 is a schematic partial cross-sectional view of a display apparatus according to some embodiments.

FIG. 13 is a schematic partial cross-sectional view of a display apparatus 1' according to some embodiments.

Referring to FIG. 13, the display apparatus 1' includes a first inorganic insulating layer IL1 arranged in a transmission area TA and a pixel area PA, and a second inorganic insulating layer IL2 arranged on the first inorganic insulating layer IL1 to correspond to the pixel area PA and having a transmission hole HT corresponding to the transmission area TA. In some embodiments, the first inorganic insulating layer IL1 may include a barrier layer 110, and the second inorganic insulating layer IL2 may include a buffer layer 111, a gate insulating layer 112, a first interlayer insulating layer 113, and a second interlayer insulating layer 115.

The first inorganic insulating layer IL1 may be arranged on an entirety of the display area DA, including a first area DA1, over the transmission area TA and the pixel area PA. In some embodiments, a thickness h of the first inorganic insulating layer IL1 corresponding to the transmission area TA may be the same as the thickness of the first inorganic insulating layer IL1 corresponding to the pixel area PA. In this case, the thickness h of the first inorganic insulating layer IL1 corresponding to the transmission area TA may be about 2,500 Å or more. In some embodiments, the thickness h of the first inorganic insulating layer IL1 may be about 2,500 Å to about 8,500 Å. Because the thickness h of the first inorganic insulating layer IL1 corresponding to the transmission area TA is about 2,500 Å or more, it is possible to reduce or prevent outgas generated in the substrate 100 that would otherwise flow into a display layer DSL. However, when the thickness h of the first inorganic insulating layer IL1 is increased to about 8,500 Å or more, the light transmittance of the transmission area TA may be lowered.

A transmission hole HT of the second inorganic insulating layer IL2, a first hole H1 of a first organic insulating layer 117, a second hole H2 of a second organic insulating layer 118, and a third hole H3 of a third organic insulating layer 119 may be provided to correspond to the transmission area TA. The transmission hole HT, the first hole H1, the second hole H2, and the third hole H3 may overlap each other.

Inner stepped surfaces 117-S, 118-S, and 119-S of the first to third holes H1, H2, and H3, including an inner stepped surface IL2-S of the transmission hole HT facing the transmission area TA, may each have a stair shape. In other words, a width W3 of the third hole H3 in one direction (e.g., the x direction) may be greater than a width W2 of the second hole H2, the width W2 of the second hole H2 may be greater than a width W1 of the first hole H1, and the width W1 of the first hole H1 may be greater than a width Wt of the transmission hole HT.

FIG. 14 is a table showing experimental results of display apparatuses of Example and Comparative Examples.

Referring to one of FIGS. 8, 11, 12, and 13 together with FIG. 14, Comparative Example 1 (C1) in which the thickness of the first inorganic insulating layer IL1 was about 0 Å, Comparative Example 2 (C2) in which the thickness of the first inorganic insulating layer IL1 was about 1,000 Å, and Example (E) in which the thickness of the first inorganic insulating layer IL1 was about 2,500 Å were compared. In Comparative Example 1 (C1), that the thickness of the first inorganic insulating layer IL1 was about 0 Å may mean a state in which the substrate 100 was exposed by removing up to the first inorganic insulating layer IL1 on the transmission area TA. In Comparative Example 2 (C2) and Example (E), that the thickness of the first inorganic insulating layer IL1 was respectively about 1,000 Å and about 2,500 Å may mean that the thickness of the first inorganic insulating layer IL1 on the transmission area TA was about 1,000 Å and about 2,500 Å, respectively. This is limited to the thickness of the first inorganic insulating layer IL1 on the transmission area TA, and the first inorganic insulating layer IL1 on the pixel area PA may be thicker.

The number of samples means the number of experimental samples put into the experiment. The samples were exposed to harsh conditions (e.g., relatively high temperature, relatively high pressure, etc.), and a defect rate was measured after about 500 hours. The term "defect rate" as used herein refers to a case in which the organic light-emitting diode OLED was damaged by outgas generated in the substrate 100.

Referring to Comparative Example 1 (C1), when the thickness of the first inorganic insulating layer IL1 was about 0 Å, and 20 samples were tested, a defect occurred in all the 20 samples. Thus, a defect rate was 100%. Referring to Comparative Example 2 (C2), when the thickness of the first inorganic insulating layer IL1 was about 1,000 Å, and ten samples were tested, a defect occurred in eight samples among the ten samples. Thus, a defect rate was 80%.

However, in Example (E), when the thickness of the first inorganic insulating layer IL1 was about 2,500 Å and ten samples were tested, no defect occurred in the ten samples. Thus, a defect rate was 0%.

Through these experimental results, it may be seen that the thickness of the first inorganic insulating layer IL1 arranged on the transmission area TA may be about 2,500 Å or more. Therefore, in the display apparatuses 1 and 1' according to some embodiments, because the first inorganic insulating layer IL1 having a thickness of about 2,500 Å or more is arranged on the transmission area TA, it is possible to reduce or prevent outgas from flowing from the transmission area TA through the substrate 100.

Although the display apparatus has been described, the disclosure is not limited thereto. For example, methods of manufacturing the display apparatus will also fall within the scope of the disclosure.

According to one or more embodiments, a display apparatus in which a display area is expanded to enable image representation even in an area in which a component is arranged may be implemented. The scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display apparatus comprising:
    a substrate having adjacent first and second areas for displaying an image, the first area comprising a transmission area and a pixel area;
    a first inorganic insulating layer on the transmission area and the pixel area;
    a second inorganic insulating layer on the first inorganic insulating layer to correspond to the pixel area, and defining a transmission hole corresponding to the transmission area;
    a first organic insulating layer on the second inorganic insulating layer;
    a second organic insulating layer on the first organic insulating layer, and defining a second hole corresponding to the transmission area;
    a pixel electrode on the second organic insulating layer; and
    a third organic insulating layer comprising a pixel defining layer covering an edge of the pixel electrode, and exposing a central portion thereof,
    wherein an inner side surface of the transmission hole is clad with the first organic insulating layer, and
    wherein a width of the second hole is greater than a width of the transmission hole.

2. The display apparatus of claim 1, wherein the first organic insulating layer contacts the first inorganic insulating layer in the transmission area.

3. The display apparatus of claim 1, wherein the first organic insulating layer directly contacts the inner side surface of the transmission hole.

4. The display apparatus of claim 1, wherein the first organic insulating layer defines a first hole corresponding to the transmission area, and
    wherein the width of the second hole is greater than the width of the first hole.

5. A display apparatus comprising:
    a substrate having adjacent first and second areas for displaying an image, the first area comprising a transmission area and a pixel area;
    a first inorganic insulating layer on the transmission area and the pixel area, a thickness of the first inorganic insulating layer in the transmission area being less than a thickness of the first inorganic insulating layer in the pixel area,
    a transistor including a gate electrode on the first inorganic insulating layer in the pixel area;
    a second inorganic insulating layer on the first inorganic insulating layer to correspond to the pixel area, covering the gate electrode, and defining a transmission hole corresponding to the transmission area;
    a first organic insulating layer on the second inorganic insulating layer;
    a second organic insulating layer on the first organic insulating layer, and defining a second hole corresponding to the transmission area;
    a pixel electrode on the second organic insulating layer; and
    a third organic insulating layer comprising a pixel defining layer covering an edge of the pixel electrode, exposing a central portion thereof, and defining a third hole corresponding to the transmission area,
    wherein the second organic insulating layer directly contacts an inner side surface of the transmission hole, and
    wherein a width of the third hole is greater than a width of the second hole.

6. The display apparatus of claim 5, wherein a width of the second hole is less than a width of the transmission hole.

7. The display apparatus of claim 6, wherein the first organic insulating layer defines a first hole corresponding to the transmission area, and
wherein a width of the second hole is less than the width of the first hole.

8. The display apparatus of claim 1, wherein a thickness of the first inorganic insulating layer in the transmission area is about 2,500 Å or more.

9. The display apparatus of claim 1, further comprising:
an intermediate layer on the pixel electrode and comprising an emission layer;
and an opposite electrode on the intermediate layer.

10. The display apparatus of claim 9, wherein the intermediate layer and the opposite electrode are on an entirety of the first area.

11. The display apparatus of claim 10, further comprising a thin-film encapsulation layer comprising a first inorganic encapsulation layer on the opposite electrode, a second inorganic encapsulation layer on the first inorganic encapsulation layer, and an organic encapsulation layer between the first inorganic encapsulation layer and the second inorganic encapsulation layer.

12. The display apparatus of claim 9, wherein the intermediate layer and the opposite electrode each define an opening corresponding to the transmission area.

13. The display apparatus of claim 1, wherein the second inorganic insulating layer comprises a buffer layer directly contacting the first inorganic insulating layer, a gate insulating layer on the buffer layer, and an interlayer insulating layer on the gate insulating layer.

14. The display apparatus of claim 13, further comprising a metal layer between the first inorganic insulating layer and the buffer layer.

15. The display apparatus of claim 14, wherein the metal layer is configured to receive a constant voltage.

16. The display apparatus of claim 13, further comprising a thin-film transistor on the pixel area and comprising:
a semiconductor layer between the buffer layer and the gate insulating layer;
a gate electrode between the gate insulating layer and the interlayer insulating layer; and
an electrode layer between the interlayer insulating layer and the first organic insulating layer.

17. The display apparatus of claim 1, further comprising:
a first pixel in the pixel area; and
a second pixel in the second area,
wherein, when the first pixel and the second pixel emit a same color, an emission area of the first pixel being greater than an emission area of the second pixel.

18. The display apparatus of claim 1, wherein a resolution of the first area is less than a resolution of the second area, and
wherein the substrate comprises a first organic base layer, a second organic base layer, and an inorganic base layer therebetween.

19. A display apparatus comprising:
a substrate having adjacent first and second areas for displaying an image, the first area comprising a transmission area and a pixel area;
a first inorganic insulating layer on the transmission area and the pixel area;
a second inorganic insulating layer on the first inorganic insulating layer to correspond to the pixel area, and defining a transmission hole corresponding to the transmission area;
a bottom metal layer disposed between the first inorganic insulating layer and the second inorganic insulating layer in the pixel area;
a first organic insulating layer on the second inorganic insulating layer, and defining a first hole corresponding to the transmission area;
a second organic insulating layer on the first organic insulating layer, and defining a second hole corresponding to the transmission area, a width of the second hole being greater than a width of the first hole;
a pixel electrode on the second organic insulating layer; and
a third organic insulating layer comprising a pixel defining layer covering an edge of the pixel electrode, and exposing a central portion thereof,
wherein a thickness of the first inorganic insulating layer in the transmission area is about 2,500 Å or more.

20. The display apparatus of claim 19, wherein the first inorganic insulating layer comprises a barrier layer.

21. The display apparatus of claim 20, wherein the second inorganic insulating layer comprises a buffer layer on the barrier layer, a gate insulating layer on the buffer layer, and an interlayer insulating layer on the gate insulating layer, and
wherein the display apparatus further comprises a thin-film transistor comprising a semiconductor layer on the buffer layer, a gate electrode on the semiconductor layer with the gate insulating layer therebetween, and an electrode layer on the gate electrode with the interlayer insulating layer therebetween.

22. The display apparatus of claim 19, wherein the first hole corresponds to the transmission hole,
wherein the width of the first hole is greater than a width of the transmission hole.

23. The display apparatus of claim 22, wherein a stepped surface of the transmission hole facing the transmission area, a stepped surface of the first hole, and a stepped surface of the second hole form a stair shape.

24. A display apparatus comprising:
a substrate having adjacent first and second areas for displaying an image, the first area comprising a transmission area and a pixel area;
a first inorganic insulating layer on the transmission area and the pixel area;
a transistor including a gate electrode on the first inorganic insulating layer in the pixel area;
a second inorganic insulating layer on the first inorganic insulating layer to correspond to the pixel area, covering the gate electrode and defining a transmission hole corresponding to the transmission area;
a bottom metal layer disposed between the first inorganic insulating layer and the second inorganic insulating layer in the pixel area;
a first organic insulating layer on the second inorganic insulating layer, and defining a first hole corresponding to the transmission area;
a second organic insulating layer on the first organic insulating layer, and defining a second hole corresponding to the transmission area;
a pixel electrode on the second organic insulating layer; and
a third organic insulating layer comprising a pixel defining layer covering an edge of the pixel electrode, and exposing a central portion thereof, and defining a third hole corresponding to the transmission area,
wherein the transmission hole of the second inorganic insulating layer has an inner side surface, and clad with at least one of the first organic insulating layer and the second organic insulating layer, and wherein a width of the third hole is greater than a width of the second hole.

25. The display apparatus of claim 24, wherein at least one of the first organic insulating layer and the second organic insulating layer contacts the first inorganic insulating layer.

26. The display apparatus of claim 24, wherein the first organic insulating layer directly contacts the inner side surface.

27. The display apparatus of claim 26, wherein the first hole corresponds to the transmission hole, wherein a width of the first hole is less than a width of the transmission hole.

28. The display apparatus of claim 27, wherein a width of the second hole is less than the width of the first hole.

29. The display apparatus of claim 24, wherein the second organic insulating layer directly contacts the inner side surface.

* * * * *